(12) United States Patent  
Shirasaki

(10) Patent No.: US 12,292,604 B2  
(45) Date of Patent: May 6, 2025

(54) OPTICAL MODULE

(71) Applicant: Mitsubishi Electric Corporation, Tokyo (JP)

(72) Inventor: Akio Shirasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 260 days.

(21) Appl. No.: 18/043,863

(22) PCT Filed: Nov. 19, 2020

(86) PCT No.: PCT/JP2020/043158  
§ 371 (c)(1),  
(2) Date: Mar. 2, 2023

(87) PCT Pub. No.: WO2022/107269  
PCT Pub. Date: May 27, 2022

(65) Prior Publication Data  
US 2023/0280551 A1 Sep. 7, 2023

(51) Int. Cl.  
*H04B 10/00* (2013.01)  
*G02B 6/42* (2006.01)  
(Continued)

(52) U.S. Cl.  
CPC ......... *G02B 6/4239* (2013.01); *G02B 6/4266* (2013.01); *H01S 5/02251* (2021.01); *H01S 5/02253* (2021.01); *H01S 5/0239* (2021.01)

(58) Field of Classification Search  
CPC .. G02B 6/4239; G02B 6/4266; G02B 6/4204; G02B 6/4286; H01S 5/02251;  
(Continued)

(56) References Cited

U.S. PATENT DOCUMENTS 5,016,965 A * 5/1991 Marshall .............. G02B 6/4204  
    385/35  
5,068,865 A * 11/1991 Ohshima .............. G02B 6/4225  
    372/36  
(Continued)

FOREIGN PATENT DOCUMENTS

JP   S59-149075 A   8/1984  
JP   2000-114648 A   4/2000

OTHER PUBLICATIONS

International Search Report issued in PCT/JP2020/043158; mailed Feb. 2, 2021.

*Primary Examiner* — Agustin Bello  
(74) *Attorney, Agent, or Firm* — Studebaker Brackett PLLC

(57) ABSTRACT

This optical module comprises: a semiconductor laser, an optical receiver, and a lens that are mounted on a carrier; an optical fiber; and a control circuit that controls the injection current of the laser such that the output current is kept constant. The lens and at least a part of the receiver are respectively fixed on the carrier with resin bonding materials that undergo thermosetting shrinkage. Initial positions in the laser, a tip end part of the optical fiber, the receiver, and the lens with respect to a reference as the rear surface of the carrier are determined such that change trends of the optical coupling efficiency characteristics between the laser and the receiver and between the laser and the optical fiber are to be the same with respect to an exposure time during which the optical module is exposed to environmental temperature higher than room temperature.

20 Claims, 14 Drawing Sheets

(51) Int. Cl.
*H01S 5/02251* (2021.01)
*H01S 5/02253* (2021.01)
*H01S 5/0239* (2021.01)

(58) Field of Classification Search
CPC .. H01S 5/02253; H01S 5/0239; H01S 5/0237; H01S 5/02469; H01S 5/0683; H01S 5/02326
See application file for complete search history.

(56) References Cited

U.S. PATENT DOCUMENTS

| | | | | |
|---|---|---|---|---|
| 6,282,350 | B1* | 8/2001 | Takahashi | G02B 6/4243 385/94 |
| 7,062,133 | B2* | 6/2006 | Azimi | G02B 6/4226 385/33 |
| 7,085,079 | B2* | 8/2006 | Okazaki | G02B 6/4227 385/33 |
| 8,475,056 | B2* | 7/2013 | Yalamanchili | G02B 6/423 385/88 |
| 10,003,168 | B1* | 6/2018 | Villeneuve | G01S 7/4818 |
| 10,146,020 | B1* | 12/2018 | Yasumura | G02B 6/12004 |
| 10,348,051 | B1* | 7/2019 | Shah | G01S 17/34 |
| 10,566,761 | B2* | 2/2020 | Miura | H01S 5/022 |
| 10,746,945 | B1* | 8/2020 | Droz | G02B 6/4225 |
| 11,564,312 | B2* | 1/2023 | Verslegers | H05K 1/0274 |
| 2002/0005522 | A1* | 1/2002 | Miyokawa | G02B 6/4237 257/79 |
| 2002/0048297 | A1* | 4/2002 | Irie | G02B 6/4271 372/36 |
| 2002/0153092 | A1* | 10/2002 | Rinne | H05K 3/3436 156/278 |
| 2003/0128552 | A1* | 7/2003 | Takagi | G02B 6/4221 362/555 |
| 2004/0027631 | A1* | 2/2004 | Nagano | G02B 6/4249 372/36 |
| 2005/0074039 | A1* | 4/2005 | Kuramachi | G02B 6/4239 372/98 |
| 2005/0168826 | A1* | 8/2005 | Koulikov | G02B 6/4206 359/641 |
| 2010/0119231 | A1* | 5/2010 | Kim | G02B 6/1221 372/92 |
| 2010/0178012 | A1* | 7/2010 | Kanemoto | G02B 6/4204 156/60 |
| 2010/0208756 | A1* | 8/2010 | Noh | G02B 6/4206 372/20 |
| 2010/0266241 | A1* | 10/2010 | Hosoda | G02B 6/4201 216/26 |
| 2011/0026877 | A1* | 2/2011 | Yalamanchili | G02B 6/423 29/25.01 |
| 2011/0242835 | A1* | 10/2011 | Masuko | G02B 6/4239 362/551 |
| 2013/0075031 | A1* | 3/2013 | Lai | G02B 6/4246 156/275.7 |
| 2013/0215924 | A1* | 8/2013 | Brennan | H01S 5/02326 228/175 |
| 2015/0286015 | A1* | 10/2015 | Miyokawa | G02B 6/4239 385/33 |
| 2017/0038541 | A1* | 2/2017 | Fujimura | G02B 6/4225 |
| 2017/0153400 | A1* | 6/2017 | Kasai | H01S 5/0071 |
| 2017/0170629 | A1* | 6/2017 | Lerner | G02B 19/0052 |
| 2019/0252863 | A1* | 8/2019 | Chen | G02B 6/4296 |
| 2019/0317284 | A1* | 10/2019 | Matsuoka | G02B 6/4214 |
| 2019/0323663 | A1* | 10/2019 | Rudy | H01S 5/34333 |
| 2020/0041734 | A1* | 2/2020 | Mori | G02B 6/4239 |
| 2020/0363597 | A1* | 11/2020 | He | G02B 6/4239 |
| 2021/0088722 | A1* | 3/2021 | Razdan | H01L 24/16 |
| 2021/0126425 | A1* | 4/2021 | Lin | H01S 5/021 |
| 2021/0157071 | A1* | 5/2021 | Shikama | G02B 6/4243 |
| 2021/0181439 | A1* | 6/2021 | Morioka | G02B 6/4214 |
| 2022/0026637 | A1* | 1/2022 | Asselin | G02B 6/30 |
| 2022/0252799 | A1* | 8/2022 | Zhu | G02B 6/4296 |
| 2023/0280551 | A1* | 9/2023 | Shirasaki | H01S 5/02326 385/88 |

* cited by examiner

OPTICAL MODULE

BACKGROUND ART

An optical module for transmitting an optical signal used in an optical communication system includes a semiconductor laser as a light source for transmitting an optical signal, a light receiving element such as a monitor photodiode, and an optical fiber. The emission light from a front end face of the semiconductor laser is introduced into the optical fiber, and is used for output light of the optical module. The emission light from a rear end face of the semiconductor laser is introduced into the light receiving element, and the light receiving element outputs a light absorption current proportional to the received optical power as a monitor current. In order to achieve stable communication, it is desirable that the output optical power of the optical module should be always constant. However, the optical output power may fluctuate due to the following two factors.

The first factor is a decrease in light emission efficiency of the semiconductor laser. When a semiconductor laser is energized for a long time, it deteriorates and its light emission efficiency decreases. That is, the optical output when a constant injection current is applied to the semiconductor laser decreases over time. However, this problem can be solved by automatic optical power control (APC) using a light receiving element. As described above, the light receiving element outputs a monitor current proportional to the received optical power. Feedback control is performed on the value of the injection current so as to keep the monitor current constant even when the light emission efficiency of the semiconductor laser decreases, so that the injection current is increased in accordance with the decrease in the monitor current to suppress the decrease in the optical output. Such control is referred to as the automatic optical power control (APC).

The second factor is a relative positional deviation between the semiconductor laser and the optical fiber. For example, when the temperature around the optical module changes, components holding the semiconductor laser and the optical fiber are thermally deformed depending on their materials. If the thermal deformation amounts in the components holding the semiconductor laser and the optical fiber are different from each other, the relative positional deviation occurs between the semiconductor laser and the optical fiber, and the introduced light amount (introduced optical power) of the emission light emitted from the semiconductor laser to the optical fiber fluctuates. That is, the optical coupling efficiency, which is a ratio of the introduced optical power to the emitted optical power, the emitted optical power being the optical power inputted to the optical fiber, the introduced optical power being the power of propagating light introduced to the optical fiber, fluctuates. An optical module is disclosed in Patent Document 1 as a conventional example, in which an optical fiber into which the emission light of a semiconductor laser is introduced is fixed to a stem as a component of a package with a fixing member made of a resin. In the optical module described as the conventional example in Patent Document 1, the semiconductor laser is fixed to the stem via solder and a submount, and the optical fiber is fixed to the stem with the fixing member made of a resin, so that relative positional deviation occurs between the semiconductor laser and the optical fiber due to thermal deformation of the fixing member made of the resin.

In FIG. 5 and FIG. 6 of Patent Document 1, an optical module is disclosed in which an adjuster made of a material having a thermal expansion coefficient equivalent to that of the stem is interposed between the optical fiber and the stem to reduce the relative positional deviation between the semiconductor laser and the optical fiber at the time when the optical fiber is fixed to the stem. As described above, in general, in order to reduce the relative positional deviation, measures have been taken to match the thermal deformation amount of each component holding the semiconductor laser and the optical fiber or to reduce the thermal deformation amount, but it is difficult to completely eliminate the relative positional deviation due to various design restrictions.

CITATION LIST

Patent Document

Patent Document 1: Japanese Patent Application Publication Laid-open, No. S59-149075 (FIG. 1, FIG. 2, FIG. 5, FIG. 6)

SUMMARY OF INVENTION

Problems to be Solved by Invention

In an optical module, a lens is interposed between a semiconductor laser and an optical fiber, and emission light condensed by the lens and reduced in a beam size, i.e., a beam diameter, is introduced into the optical fiber in some cases. An optical semiconductor device such as the semiconductor laser is typically fixed to a component made of a metal, ceramics, or the like with solder by heating them to about 300° C., thereby obtaining high heat dissipation. On the other hand, optical components such as lenses and optical fibers to be combined with a semiconductor laser do not have heat resistance to be fixed with solder, and thus are fixed to components made of a metal, ceramics, or the like using an UV curable resin or the like that does not require heating. In general, an optical module for optical communication is required to have fluctuation in optical output within ±0.5 dB even when exposed to high temperature environment of 75 to 95° C. for a reference time of about 2000 hours.

When such an optical module is exposed to the high temperature environment of 75 to 95° C., the resin that fixes the lens and the optical fiber undergoes irreversible thermosetting shrinkage. On the other hand, the solder that fixes the semiconductor laser does not undergo thermosetting shrinkage, so that an irreversible relative positional deviation remains among the semiconductor laser, lens, and the optical fiber. Even if the relative positional deviation between the semiconductor laser and the optical fiber is reduced by using the adjuster as shown in FIG. 5 and FIG. 6 of Patent Document 1, a cumulative relative positional deviation between the semiconductor laser and the optical fiber including the positional deviations of optical components, that is, a compound relative positional deviation between the semiconductor laser and the optical fiber occurs when an optical component other than the optical fiber, such as a lens, is interposed. The decrease in the optical coupling efficiency due to this relative positional deviation between the semiconductor laser and the optical component or the compound relative positional deviation between the semiconductor laser and the optical fiber causes fluctuation in the optical output. Optical output fluctuation caused by the irreversible relative positional deviation between the semiconductor laser and the optical component cannot be suppressed without a special measure even if the automatic optical power control is used.

An object of the technology disclosed in the specification of the present application is to provide an optical module capable of suppressing fluctuation in an optical output if an irreversible compound relative positional deviation due to high temperature environment occurs between a semiconductor laser and an optical fiber in which an optical component is interposed.

Means for Solving Problems

An example of an optical module disclosed in the specification of the present application is an optical module that transmits an emission light emitted by a semiconductor laser through an optical fiber. The optical module includes the semiconductor laser and the optical fiber, an optical receiver to receive monitor light emitted from an end face opposite to an emission end face from which the emission light is emitted, a lens to condense the emission light, a carrier on which the semiconductor laser, the optical receiver, and the lens are mounted; and a control circuit to control an injection current of the semiconductor laser such that an output current of the optical receiver is kept constant. The semiconductor laser is fixed on the carrier with a metal bonding material, the lens and at least a part of the optical receiver are respectively fixed on the carrier with a second resin bonding material and a first resin bonding material that undergo thermosetting shrinkage, and a position of a tip end part of the optical fiber into which the emission light is introduced is fixed with respect to a reference as a rear surface of the carrier opposite to a front surface of a mounting section on which the semiconductor laser, the optical receiver, and the lens are mounted. An optical coupling efficiency between the semiconductor laser and the optical receiver and an optical coupling efficiency between the semiconductor laser and the optical fiber with respect to an exposure time during which the optical module is exposed to environmental temperature higher than room temperature are referred to as a first optical coupling efficiency characteristic and a second optical coupling efficiency characteristic, respectively, and initial positions in the semiconductor laser, the tip part end of the optical fiber, the optical receiver, and the lens with respect to the reference as the rear surface of the carrier when the exposure time of the optical module is 0 are determined such that change trends of the first optical coupling efficiency characteristic and the second optical coupling efficiency characteristic are to be the same.

Effect of Invention

In an example of the optical module disclosed in the specification of the present application, the initial positions in the semiconductor laser, the tip end part of the optical fiber, the lens, and the optical receiver with respect to the reference as the rear surface of the carrier are determined such that the change trends of the first optical coupling efficiency characteristic and the second optical coupling efficiency characteristic are to be the same with the elapse of the exposure time. Therefore, fluctuation of the optical output can be suppressed even if an irreversible compound relative positional deviation due to the high temperature environment occurs between the semiconductor laser and the optical fiber.

MODES FOR CARRYING OUT INVENTION

Embodiment 1

Figure 1:
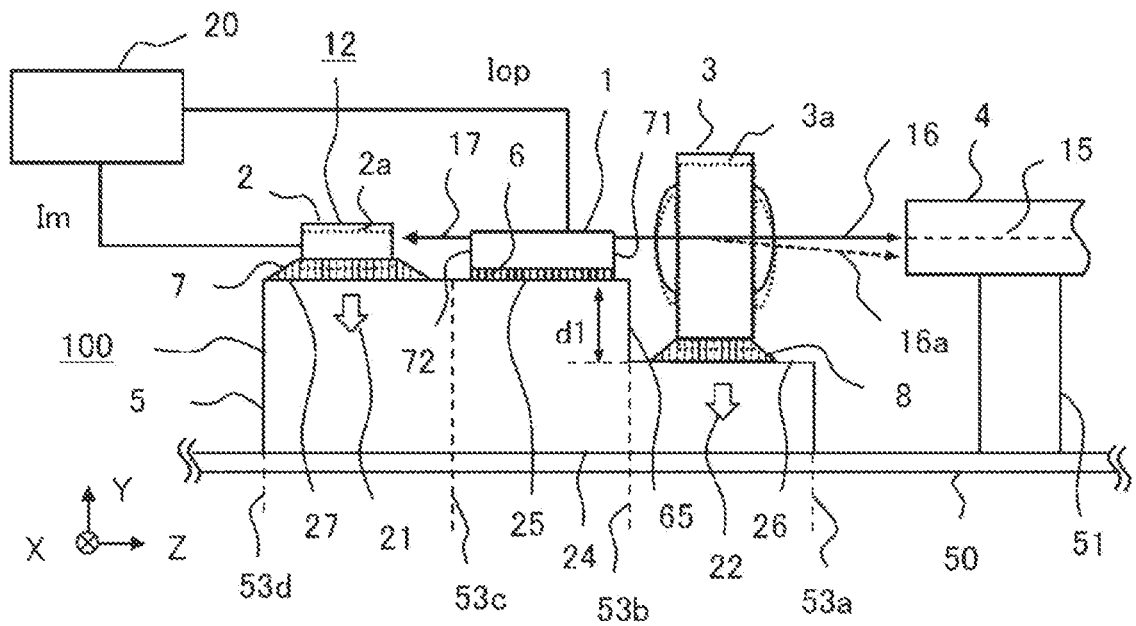
FIG. 1 is a diagram showing an optical module according to Embodiment 1.
Figure 2:
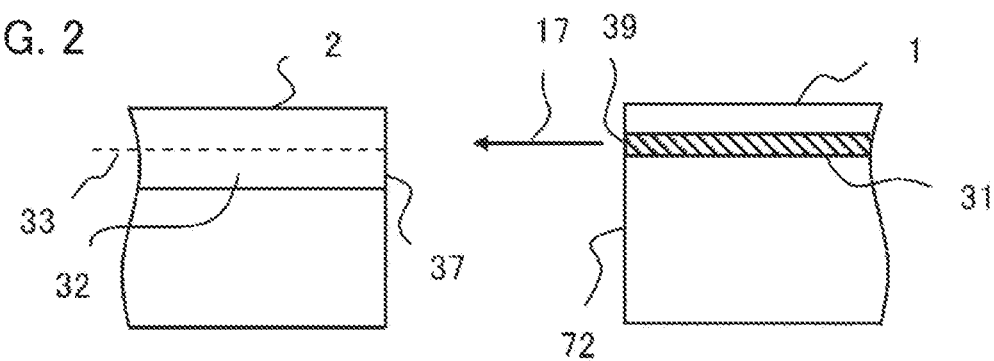
FIG. 2 is a diagram showing initial positions of a semiconductor laser and a light receiving element in FIG. 1.
Figure 3:
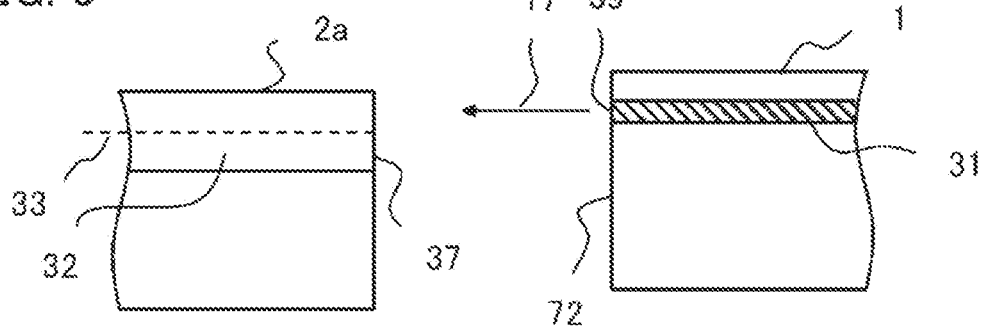
FIG. 3 is a diagram showing positions of the semiconductor laser and the light receiving element in FIG. 1 after the elapse of a reference time.
Figure 4:
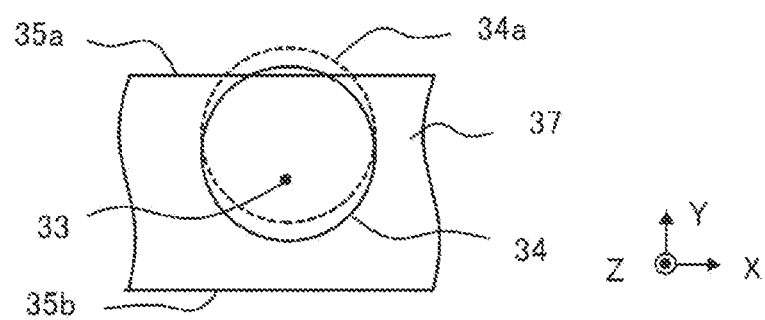
FIG. 4 is a diagram showing monitor light on a light receiving surface of the light receiving element in FIG. 1.
Figure 5:
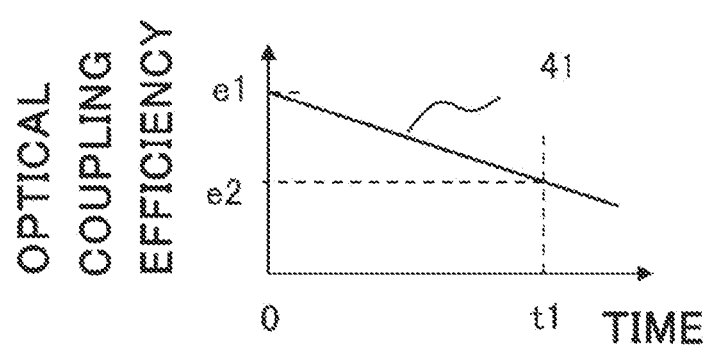
FIG. 5 is a diagram showing an optical coupling efficiency characteristic between the semiconductor laser and the light receiving element according to Embodiment 1.
Figure 6:
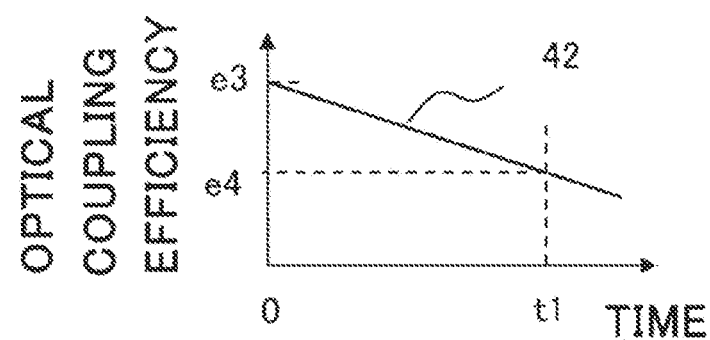
FIG. 6 is a diagram showing an optical coupling efficiency characteristic between the semiconductor laser and the optical fiber according to Embodiment 1.

FIG. 1 is a diagram showing an optical module according to Embodiment 1. FIG. 2 is a diagram showing initial positions of a semiconductor laser and a light receiving element in FIG. 1, and FIG. 3 is a diagram showing positions of the semiconductor laser and the light receiving element in FIG. 1 after the elapse of a reference time. FIG. 4 is a diagram showing monitor light on a light receiving surface of the light receiving element in FIG. 1. FIG. 5 is a diagram showing an optical coupling efficiency characteristic between the semiconductor laser and the light receiving element according to Embodiment 1, and FIG. 6 is a diagram showing an optical coupling efficiency characteristic between the semiconductor laser and an optical fiber according to Embodiment 1. The optical module 100 includes the semiconductor laser 1 for emitting emission light 16 and monitor light 17, an optical receiver 12 for receiving the monitor light 17, a lens 3 for condensing the emission light 16, an optical fiber 4 for propagating the emission light 16 condensed by the lens 3, a carrier 5 for mounting the semiconductor laser 1, the optical receiver 12, and the lens 3, and a control circuit 20 for controlling an injection current Iop of the semiconductor laser 1. In the example shown in FIG. 1, the carrier 5 is fixed to a housing 50, and a tip end part of the optical fiber 4 is fixed on a holder 51 provided in the housing 50. The emission light 16 is output light of the optical module 100 outputted to an optical receiver module or the like via the lens 3 and the optical fiber 4, and the monitor light 17 is used for controlling the injection current Iop of the semiconductor laser 1.

The semiconductor laser 1, the optical receiver 12, and the lens 3 are mounted on a front surface of the carrier 5, and a rear surface 24 of the carrier 5 is fixed to the housing 50. The rear surface 24 of the carrier 5 serves as a reference for the positions of the semiconductor laser 1, the optical receiver 12, the lens 3 and the optical fiber 4 in a direction perpendicular to the rear surface 24. The direction perpendicular to the rear surface 24 is the Y-direction, the traveling direction of the emission light 16 perpendicular to the Y-direction is the Z-direction, and the direction perpendicular to the Y-direction and the Z-direction is the X-direction. The semiconductor laser 1 emits the emission light 16 from a first end face 71 on the positive side in the Z-direction, that is, on the lens 3 side, and emits the monitor light 17 from a second end face 72 on the negative side in the Z-direction, that is, on the optical receiver 12 side. In Embodiment 1, an example in which the optical receiver 12 is the light receiving element 2 of a waveguide type is shown.

The semiconductor laser 1 is fixed on the front surface of a first mounting section 25 of the carrier 5 with a metal bonding material 6 that does not undergo thermosetting shrinkage. The light receiving element 2 serving as the optical receiver 12 is fixed on the front surface of a third mounting section 27 of the carrier 5 with a resin bonding material 7 that undergoes thermosetting shrinkage, and the lens 3 is fixed on the front surface of a second mounting section 26 of the carrier 5 with a resin bonding material 8 that undergoes thermosetting shrinkage. The second mounting section 26, the first mounting section 25, and the third mounting section 27 are arranged in this order from the side closer to the optical fiber 4. The range from a broken line 53a to a broken line 53b is the second mounting section 26, the range from the broken line 53b to a broken line 53c is the first mounting section 25, and the range from the broken line 53c to a broken line 53d is the third mounting section 27. The second mounting section 26 is a part of a recess 65 formed on the front surface side of the carrier 5, and the front surface of the second mounting section 26 corresponds to a bottom surface of the recess 65 opposite to the rear surface 24. A length d1 in the Y-direction between the front surface of the first mounting section 25 and the front surface of the second mounting section 26 corresponds to the depth of the recess 65. The front surface of the first mounting section 25 and the front surface of the third mounting section 27 are flat surfaces having no height difference.

The light receiving element 2 outputs a monitor current Im, which is a light absorption current proportional to the power of the received monitor light 17, to the control circuit 20. The control circuit 20 generates the injection current Iop so as to keep an output current outputted from the light receiving element 2, that is, the monitor current Im, constant, and outputs the injection current Iop to the semiconductor laser 1. The control circuit 20 controls the injection current Iop of the semiconductor laser 1 so that the output current from the light receiving element 2 serving as the optical receiver 12 should be kept constant. In the optical module 100, the automatic optical power control is performed by the control circuit 20.

The metal bonding material 6 is, for example, solder such as AuSn, SnAg, and SnAgCu. The resin bonding materials 7 and 8 are, for example, bonding materials containing acrylic, epoxy, thiol, or the like as main components. The metal bonding material 6 does not undergo thermosetting shrinkage, while the resin bonding materials 7 and 8 undergo thermosetting shrinkage. When exposed to environmental temperature higher than room temperature, the resin bonding materials 7 and 8 undergo thermosetting shrinkage depending on an exposure time of exposure to the environmental temperature higher than room temperature, and the thicknesses of the resin bonding materials 7 and 8 in the Y-direction decrease as indicated by arrows 21 and 22. Here, the environmental temperature is a temperature around and inside the optical module 100. The light receiving element 2 moves toward the front surface side of the third mounting section 27 due to the thermosetting shrinkage of the resin bonding material 7, and the lens 3 moves toward the front surface side of the second mounting section 26 due to the thermosetting shrinkage of the resin bonding material 8. The light receiving element 2 and the lens 3 after the exposure time has elapsed are indicated as a light receiving element 2a and a lens 3a, which are indicated by broken lines. As the exposure time elapses, the positional relationship between the semiconductor laser 1, the light receiving element 2 serving as the optical receiver 12, the lens 3, and the optical fiber 4 with respect to the reference as the rear surface 24 of the carrier 5, that is, the positional relationship in the Y-direction, changes. As a result, the optical coupling efficiency between the semiconductor laser 1 and the optical receiver 12, and the optical coupling efficiency between the semiconductor laser 1 and the optical fiber 4 change.

The optical coupling efficiency between the semiconductor laser 1 and the optical receiver 12 and the optical coupling efficiency between the semiconductor laser 1 and the optical fiber 4 with respect to the exposure time are referred to as a first optical coupling efficiency characteristic and a second optical coupling efficiency characteristic, respectively. In the optical module 100 of Embodiment 1, the automatic optical power control is performed, and initial positions of the optical receiver 12 and the lens 3 with respect to the reference as the rear surface 24 of the career 5 are determined such that change trends of the first optical coupling efficiency characteristic and the second optical coupling efficiency characteristic are to be the same. Therefore, fluctuation of the optical output can be suppressed even if an irreversible compound relative positional deviation due to high temperature environment occurs between the semiconductor laser 1 and the optical fiber 4. The compound relative positional deviation is the cumulative relative positional deviation between the semiconductor laser 1 and the optical fiber 4, including the deviations of optical components when optical components such as lens 3 are interposed, as described above. The initial positions in the optical receiver 12 and the lens 3 with respect to the reference as the rear surface 24 of the carrier 5 are positions in a case where the exposure time of the optical module 100 in the high temperature environment is zero, and are positions at the time of completion of manufacturing of the optical module 100. In the same way, the initial positions in the semiconductor laser 1 and the tip end part of the optical fiber 4 with respect to the reference as the rear surface 24 of the carrier 5 are positions in a case where the exposure time of the optical module 100 in the high temperature environment is zero, and are positions at the time of completion of manufacturing of the optical module 100. The details will be described below.

FIG. 1 illustrates an example of the optical module 100 in a case where the change trends of the first optical coupling efficiency characteristic and the second optical coupling efficiency characteristic are decreasing trends, that is, in a case where the first optical coupling efficiency and the second optical coupling efficiency decrease over time. In the optical module 100 of Embodiment 1 shown in FIG. 1, initial positions of the semiconductor laser 1, the tip end part of the optical fiber 4, the lens 3, and the light receiving element 2 serving as the optical receiver 12 with respect to the reference as the rear surface 24 of the carrier 5 are determined such that the change trends of the first optical coupling efficiency characteristic and the second optical coupling efficiency characteristic are to be the same with the elapse of the exposure time; for example, the change trends are to be the same decreasing trend (first optical coupling efficiency setting condition). With reference to FIG. 2 to FIG. 5, the optical coupling efficiency between the semiconductor 1 and the optical receiver 12 will be described.

The monitor light 17 is emitted from an emission portion 39 which is a region on the second end face 72 side in an active layer 31 of the semiconductor laser 1. The monitor light 17 is received by a light receiving portion 32 of the light receiving element 2. As described above, in general, an optical module for optical communication is required to have fluctuation in optical output within ±0.5 dB even when exposed to the high temperature environment of 75 to 95° C. for a reference time of about 2000 hours. The fluctuation in the optical output within ±0.5 dB is a standard for the reliability of the optical module 100. Therefore, FIG. 5 shows an example of the optical coupling efficiency characteristic between the semiconductor laser 1 and the light receiving element 2 when the reference time t1 is set to 2000 hours. Similarly, FIG. 6 shows an example of the optical coupling efficiency characteristic between the semiconductor laser 1 and the optical fiber 4 when the reference time t1 is set to 2000 hours. The horizontal axis is the time of exposure to environmental temperature higher than room temperature, that is, the exposure time, and the vertical axis is the optical coupling efficiency. An optical coupling efficiency characteristic 41 shown in FIG. 5 indicates the relationship between the optical coupling efficiency between the semiconductor laser 1 and the optical receiver 12, and the exposure time. In the optical coupling efficiency characteristic 41, the optical coupling efficiency decreases as the exposure time elapses, and the change trend in the characteristic is a decreasing trend. The optical coupling efficiencies at the exposure time 0 and t1 are e1 and e2 respectively.

The positions of the semiconductor laser 1 and the light receiving element 2 in the Y-direction at the exposure time of zero, that is, at the initial time, are shown in FIG. 2, and a beam cross section 34 of the monitor light 17 on a light receiving surface 37 in this case is shown in FIG. 4. The positions of the semiconductor laser 1 and the light receiving element 2 in the Y-direction when the exposure time is t1 or more, that is, when the reference time has elapsed, are shown in FIG. 3, and a beam cross section 34a of the monitor light 17 on the light receiving surface 37 in this case is shown in FIG. 4. Note that the light receiving element after the reference time has elapsed is assigned with a reference sign 2a. When the monitor light 17 is received at the light receiving surface 37 in the range from a light receiving portion end 35a on the positive side in the Y-direction of the light receiving portion 32 to a light receiving portion end 35b on the negative side in the Y-direction of the light receiving portion 32, the light receiving element 2 generates the monitor current Im. Depending on an area of the beam cross section of the monitor light 17 incident on the light receiving surface 37, that is, depending on the beam cross sectional area that increases or decreases, the monitor current Im increases or decreases. The area of the beam cross section is appropriately referred to as the beam cross sectional area. In FIG. 4, the beam cross sections 34 and 34a include a central axis 33 of the light receiving portion and are located on the side of the light receiving portion end 35a on the positive side in the Y-direction. As the exposure time elapses, the resin bonding material 7 that fixes the light receiving element 2 and the carrier 5 undergoes the thermosetting shrinkage, and the light receiving element 2 moves to the negative side in the Y-direction, so that the monitor light 17 moves to the positive side in the Y-direction on the light receiving surface 37 of the light receiving element 2. Since the area of the beam cross section 34 on the light receiving surface 37 is larger than the area of the beam cross section 34a on the light receiving surface 37, and the light receiving area of the monitor light 17 received at the light receiving surface 37 decreases as the exposure time elapses, the optical coupling efficiency between the semiconductor laser 1 and the light receiving element 2 decreases as the exposure time elapses. Accordingly, the monitor current Im of the light receiving element 2 decreases as the exposure time elapses.

Next, the optical coupling efficiency between the semiconductor laser 1 and the optical fiber 4 will be described. The optical coupling efficiency between the semiconductor laser 1 and the optical fiber 4 is at its maximum when the emission light 16 is incident along a central axis 15 of the optical fiber 4, is decreased when the angle between the emission light 16 and the central axis 15 is increased, and is decreased when the central axis of the beam of the emission light 16 is away from the central axis 15 of the optical fiber 4. FIG. 1 shows an example of cases in which, when the exposure time is 0, that is, at the initial time, the emission light 16 passes through a lens central axis of the lens 3 and is incident on the central axis 15 of the optical fiber 4, and when the exposure time is equal to or longer than t1, that is, after the elapse of the reference time, the emission light 16 passes through the lens 3 on the positive side in the Y-direction from the lens central axis of the lens 3 and is incident on the optical fiber 4 on the negative side in the Y-direction from the central axis 15 of the optical fiber 4. Note that the emission light and the lens after the reference time has elapsed are assigned with reference signs 16a and 3a, respectively.

The optical coupling efficiency characteristic 42 shown in FIG. 6 indicates the relationship between the optical coupling efficiency between the semiconductor laser 1 and the optical fiber 4, and the exposure time. And in the optical coupling efficiency characteristic 42, the optical coupling efficiency decreases as the exposure time elapses, and the change trend in the characteristic is a decreasing trend. The optical coupling efficiencies at the exposure time of 0 and at t1 are e3 and e4, respectively.

FIG. 1 illustrates an example in which the thicknesses of the resin bonding materials 7 and 8 in the Y-direction are the same. In this case, the amount of thermosetting shrinkage in the resin bonding materials 7 and 8 over the exposure time are the same, for example, the amount are 0.3 to 0.4 μm depending on the composition of the resin. Since the thicknesses of the resin bonding materials 7 and 8 in the Y-direction are the same, the light receiving element 2 and the lens 3 have the same distance of movement to the negative side in the Y-direction over the exposure time. In the optical module 100 of Embodiment 1, the positions of the semiconductor laser 1 and the tip end part of the optical fiber 4 in the Y-direction with respect to the reference as the rear surface 24 of the carrier 5 are fixed. In the optical module 100 of Embodiment 1, the initial positions in the optical receiver 12 and the lens 3 with respect to the reference as the rear surface 24 of the carrier 5 are determined such that the change trends of the first optical coupling efficiency characteristic and the second optical coupling efficiency characteristic are to be the same; for example, the change trends are to be the same decreasing trend. Although FIG. 4 shows an example in which the optical coupling efficiency between the semiconductor laser 1 and the optical receiver 12 is not at its maximum at the initial time. However the initial position of the optical receiver 12 may be set such that the optical coupling efficiency between the semiconductor laser 1 and the optical receiver 12 is to be at its maximum. In this case, the initial position of the optical receiver 12 may be determined such that the edge of the beam cross section 34 of the initial monitor light 17 within the light receiving surface 37 coincides with the light receiving portion end 35a on the positive side in the Y-direction on the light receiving surface 37. The initial position of the lens 3 may be determined such that, for example, the optical coupling efficiency between the semiconductor laser 1 and the optical fiber 4 is to be maximized or substantially maximized. The beam cross section 34 of the monitor light 17 shown in FIG. 4 is an example in which the optical coupling efficiency is substantially maximized, and is an example in which the optical coupling efficiency is 95%, for example.

In the optical module 100 of Embodiment 1, the initial positions in the semiconductor laser 1, the tip end part of the optical fiber 4, the lens 3, and the light receiving element 2 serving as the optical receiver 12 with respect to the reference as the rear surface 24 of the carrier 5 are determined such that the change trends of the first optical coupling efficiency characteristic and the second optical coupling efficiency characteristic are to be the same with the elapse of the exposure time; for example, the change trends are to be the same decreasing trend. Therefore, when the automatic optical power control is performed on the semiconductor laser 1, the control circuit 20 increases the injection current Iop of the semiconductor laser 1 with the elapse of the exposure time in order to keep the monitor current Im at a predetermined set value; that is, the injection current Iop increases over time. Thus, in the optical module 100 of Embodiment 1, even if the optical coupling efficiency between the semiconductor laser 1 and the optical fiber 4 is reduced with the elapse of the exposure time, the amount of the emission light 16, that is, the optical power is increased, so that the decrease in the introduced light amount of the emission light 16 to the optical fiber 4, that is, the decrease in the introduced optical power, can be suppressed. Further, the introduced light amount of the emission light 16 to the optical fiber 4 corresponds to the optical power of the optical module 100 used for optical communication. Therefore, in the optical module 100 of Embodiment 1, the fluctuation of the optical output can be suppressed even if the optical coupling efficiency between the semiconductor laser 1 and the optical fiber 4 changes owing to the compound relative positional deviation that occurs between the semiconductor laser 1 and the optical fiber 4 with the elapse of the exposure time.

Note that, although an example in which the thicknesses of the resin bonding materials 7 and 8 in the Y-direction are the same and the amounts of thermosetting shrinkage over the exposure time are the same has been described, this is not a limitation. In the optical module 100, since the automatic optical power control is performed, it is desirable that the end time of the thermosetting shrinkage of the resin bonding material 7 used for fixing the light receiving element 2 should be later than the end time of the thermosetting shrinkage of the resin bonding material 8 used for fixing the lens 3 in order to extend the controllable period by the automatic optical power control, that is, the period in which the fluctuation of the optical power can be suppressed. Note that the period in which the fluctuation of the optical output can be suppressed can also be referred to as a product lifetime. In addition, FIG. 5 and FIG. 6 illustrate examples in which the thermosetting shrinkage of the resin bonding materials 7 and 8 is not completed.

As described above, the optical module 100 of Embodiment 1 is an optical module that transmits the emission light 16 emitted by the semiconductor laser 1 through the optical fiber 4. The optical module 100 of Embodiment 1 includes the semiconductor laser 1, the optical fiber 4, the optical receiver 12 to receive the monitor light 17 emitted from the end face (the second end face 72) opposite to the emission end face (the first end face 71) from which the emission light 16 is emitted, the lens 3 to condense the emission light 16, the carrier 5 on which the semiconductor laser 1, the optical receiver 12, and lens 3 are mounted, and the control circuit 20 to control the injection current Iop of the semiconductor laser 1 such that the output current (the monitor current Im) of the optical receiver 12 is kept constant. The semiconductor laser 1 is fixed on the carrier 5 with the metal bonding material 6, at least part of the optical receiver 12, and the lens 3 are respectively fixed on the carrier 5 with a first resin bonding material (resin bonding material 7) and a second resin bonding material (resin bonding material 8) that undergo the thermosetting shrinkage, and the position of the tip end part of the optical fiber 4 into which the emission light 16 is introduced is fixed with respect to the reference as the rear surface 24 of the carrier 5 opposite to the front surface of the mounting section (first mounting section 25, third mounting section 27, second mounting section 26) on which the semiconductor laser 1, the optical receiver 12, and the lens 3 are mounted on the carrier 5. The optical coupling efficiency between the semiconductor laser 1 and the optical receiver 12 and the optical coupling efficiency between the semiconductor laser 1 and the optical fiber 4 with respect to the exposure time during which the optical module 100 is exposed to environmental temperature higher than room temperature are referred to as the first optical coupling efficiency characteristic and the second optical coupling efficiency characteristic, respectively. The initial positions in the semiconductor laser 1, the tip end part of the optical fiber 4, the optical receiver 12, and the lens 3 with respect to the reference as the rear surface 24 of the carrier 5 when the exposure time of the optical module is 0 are determined such that the change trends of the first optical coupling efficiency characteristic and the second optical coupling efficiency characteristic are to be the same. In the optical module 100 of Embodiment 1, with this configuration, the initial positions in the semiconductor laser 1, the tip end part of the optical fiber 4, the lens 3, and the optical receiver 12 with respect to the reference as the rear surface 24 of the carrier 5 are determined such that the change trends of the first optical coupling efficiency characteristic and the second optical coupling efficiency characteristic are to be the same with the elapse of the exposure time. Therefore, the fluctuation of the optical output can be suppressed even if the irreversible compound relative positional deviation due to the high temperature environment occurs between the semiconductor laser 1 and the optical fiber 4.

Embodiment 2

Figure 7:
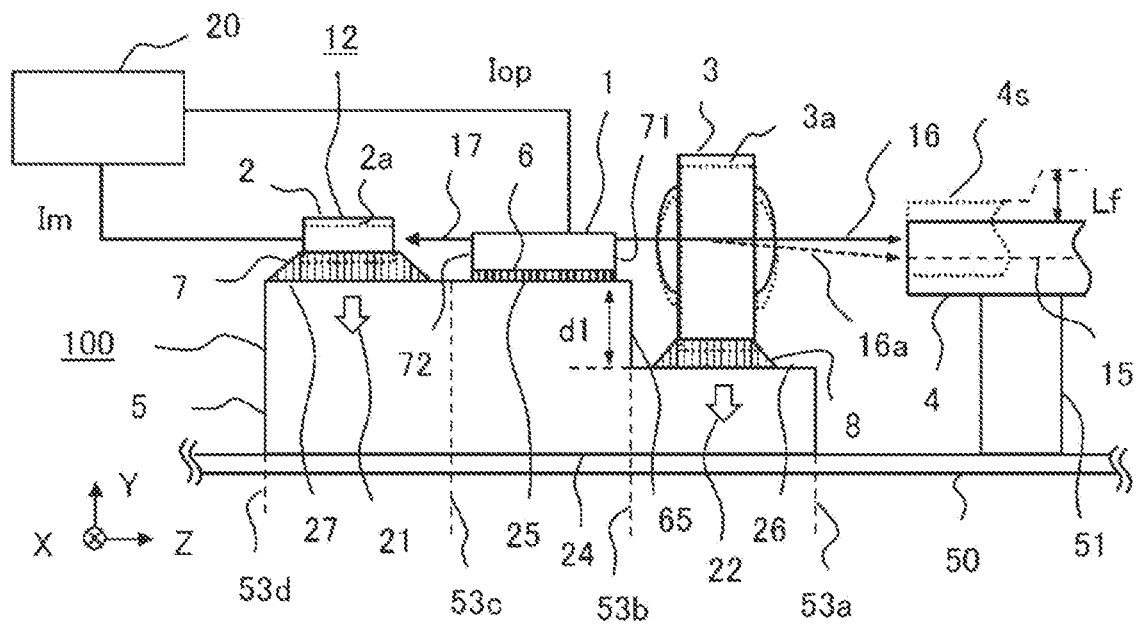
FIG. 7 is a diagram showing a first example of an optical module according to Embodiment 2.
Figure 8:
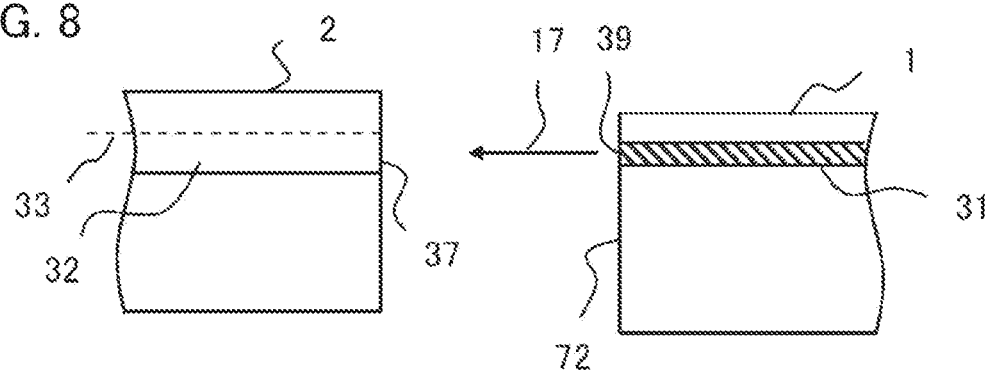
FIG. 8 is a diagram showing initial positions of a semiconductor laser and a light receiving element shown in FIG. 7.
Figure 9:
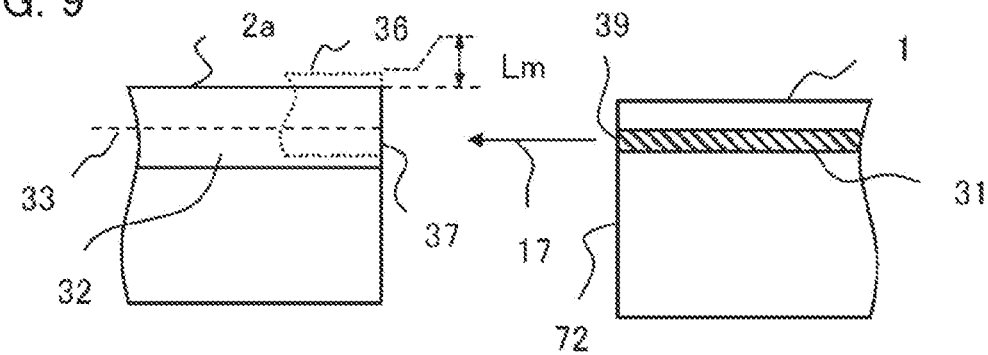
FIG. 9 is a diagram showing positions of the semiconductor laser and the light receiving element in FIG. 7 after the elapse of the reference time.
Figure 10:
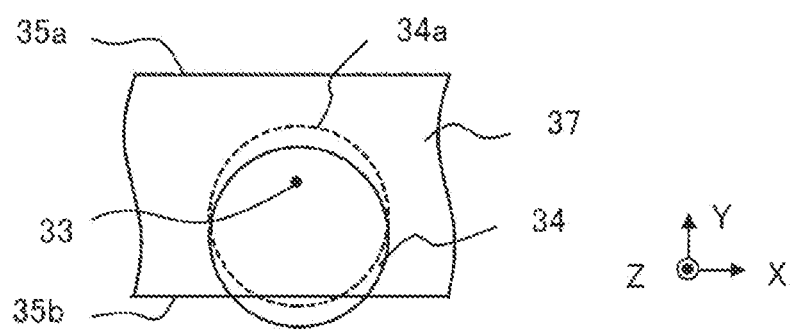
FIG. 10 is a diagram showing monitor light on a light receiving surface of the light receiving element in FIG. 7.
Figure 11:
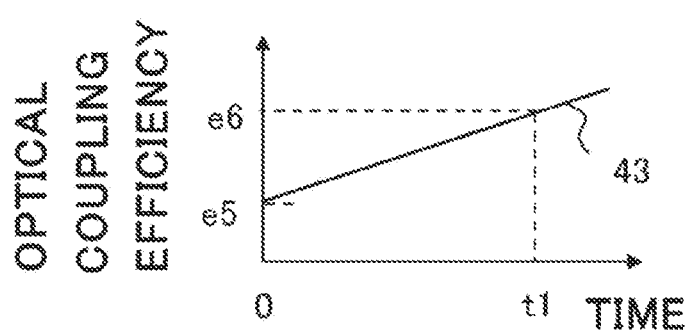
FIG. 11 is a diagram showing an optical coupling efficiency characteristic between the semiconductor laser and the light receiving element according to Embodiment 2.
Figure 12:
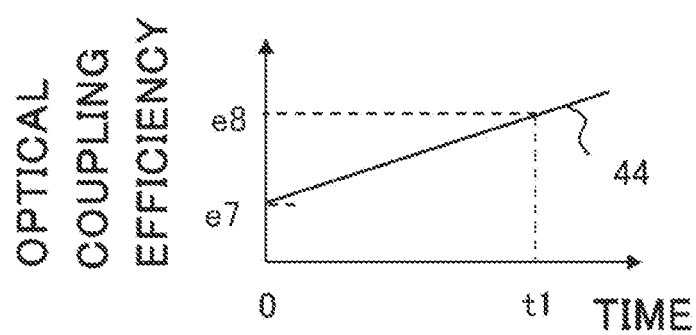
FIG. 12 is a diagram showing a first example of an optical coupling efficiency characteristic between the semiconductor laser and an optical fiber according to Embodiment 2.
Figure 13:
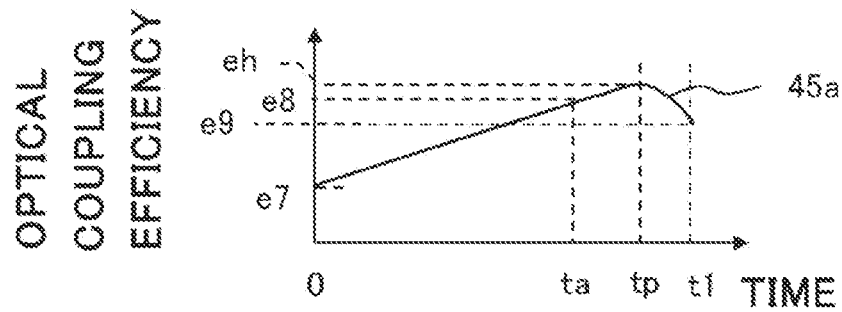
FIG. 13 is a diagram showing a second example of an optical coupling efficiency characteristic between the semiconductor laser and the optical fiber according to Embodiment 2.
Figure 14:
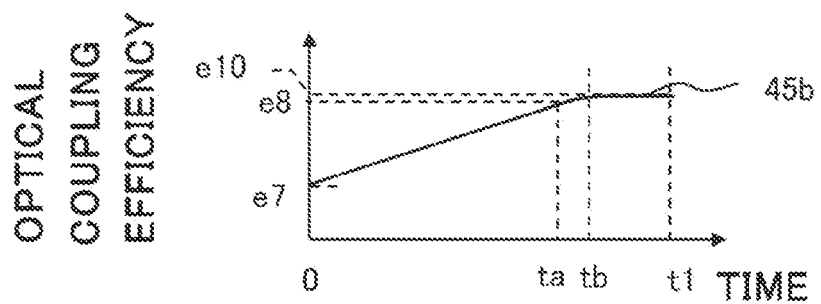
FIG. 14 is a diagram showing a third example of an optical coupling efficiency characteristic between the semiconductor laser and the optical fiber according to Embodiment 2.
Figure 15:
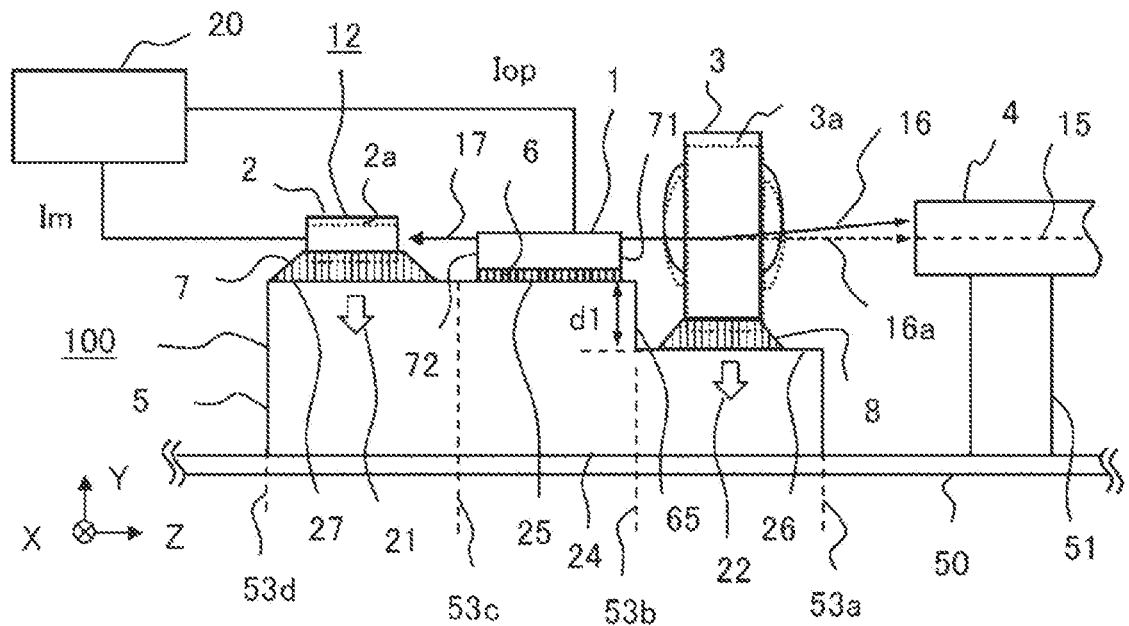
FIG. 15 is a diagram showing a second example of the optical module according to Embodiment 2.
Figure 16:
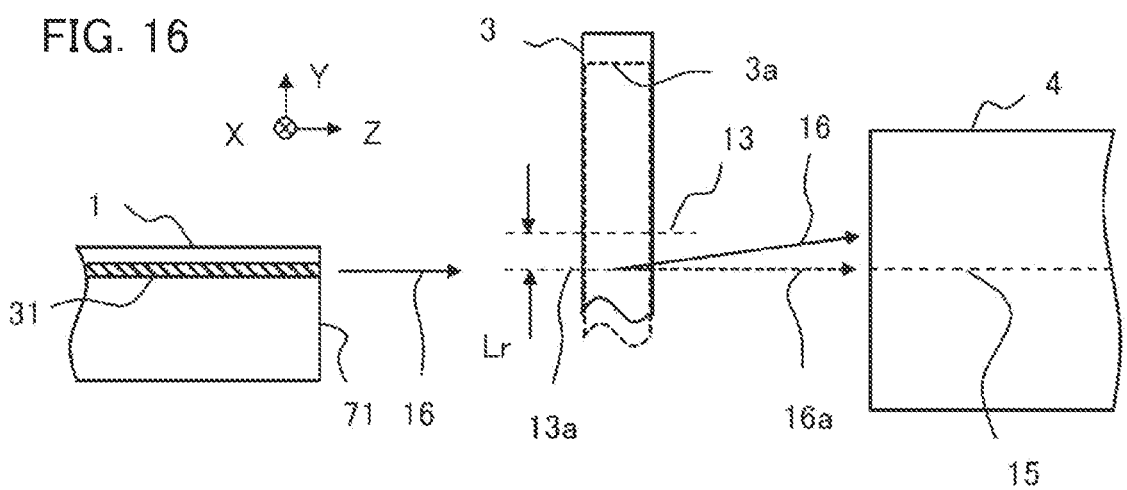
FIG. 16 is a diagram showing positional changes of a lens and laser light in FIG. 15.

FIG. 7 is a diagram showing a first example of an optical module according to Embodiment 2. FIG. 8 is a diagram showing initial positions of a semiconductor laser and a light receiving element in FIG. 7, and FIG. 9 is a diagram showing initial positions of the semiconductor laser and the light receiving element in FIG. 7 after the elapse of the reference time. FIG. 10 is a diagram showing the monitor light on the light receiving surface of the light receiving element in FIG. 7. FIG. 11 is a diagram showing an optical coupling efficiency characteristic between the semiconductor laser and the light receiving element according to Embodiment 2, and FIG. 12 is a diagram showing a first example of an optical coupling efficiency characteristic between the semiconductor laser and the optical fiber according to Embodiment 2. FIG. 13 is a diagram showing a second example of an optical coupling efficiency characteristic between the semiconductor laser and the optical fiber according to Embodiment 2, and FIG. 14 is a diagram showing a third example of the optical coupling efficiency characteristic between the semiconductor laser and the optical fiber according to Embodiment 2. FIG. 15 is a diagram showing a second example of the optical module according to Embodiment 2, and FIG. 16 is a diagram showing positional changes of the lens and the laser light in FIG. 15. The optical module 100 of Embodiment 2 is different from the optical module 100 of Embodiment 1 in that the initial positions in the semiconductor laser 1, the tip end part of the optical fiber 4, the lens 3, and the light receiving element 2 serving as the optical receiver 12 with respect as the reference of the rear surface 24 of the carrier 5 are determined such that the change trends of the first optical coupling efficiency characteristic and the second optical coupling efficiency characteristic are to be the same with the elapse of the exposure time; for example, the change trends are to be the same increasing tend in a certain period of time from the initial time. Parts different from the optical module 100 of Embodiment 1 will be mainly described.

FIG. 7 illustrates an example of the optical module 100 in which the first optical coupling efficiency characteristic and the second optical coupling efficiency characteristic are in an increasing trend in a certain period of time from the initial time, that is, the first optical coupling efficiency characteristic and the second optical coupling efficiency characteristic increase over time in a certain period of time from the initial time. In order for the first optical coupling efficiency characteristic and the second optical coupling efficiency characteristic to increase over time in a certain period of time from the initial time with the elapse of the exposure time (second optical coupling efficiency setting condition), the initial positions in the semiconductor laser 1, the tip end part of the optical fiber 4, the lens 3, and the light receiving element 2 serving as the optical receiver 12 with respect to the reference as the rear surface 24 of the carrier 5 are determined as follows, for example. As described in Embodiment 1, when the exposure time elapses, the position of the lens 3 moves to the negative side in the Y-direction (−Y-direction) due to the thermosetting shrinkage of the resin bonding material 8, and the emission light 16 also tilts to the negative side in the Y-direction to be the emission light 16a. Therefore, when the position of the optical fiber 4 is offset to the negative side in the Y-direction from, for example, the position at which the optical coupling efficiency between the semiconductor laser 1 and the optical fiber 4 is maximized or substantially maximized, the second optical coupling efficiency characteristic, which is the characteristic of the optical coupling efficiency between the semiconductor laser 1 and the optical fiber 4 with respect to the exposure time, can be made to be in an increasing trend over time in a certain period of time from the initial time. Similarly, when the exposure time elapses, the position of the light receiving element 2 serving as the optical receiver 12 moves to the negative side in the Y-direction due to the thermosetting shrinkage of the resin bonding material 7. Thus, when for example the initial position of the light receiving element 2 serving as the optical receiver 12 is offset to the positive side in the Y-direction (+Y-direction) from the position at which the optical coupling efficiency between the semiconductor laser 1 and the optical fiber 12 is maximized or substantially maximized, the first optical coupling efficiency characteristic, which is the characteristic of the optical coupling efficiency between the semiconductor laser 1 and the optical receiver 12 with respect to the exposure time, can be made to be in an increasing trend over time in a certain period of time from the initial time.

In the first example of the optical module 100 of Embodiment 2 shown in FIG. 7, the position of the optical fiber 4 is offset to the negative side in the Y-direction, and the initial position of the light receiving element 2 is offset to the positive side in the Y-direction, as compared with the optical module 100 of Embodiment 1 shown in FIG. 1. Furthermore, in the first example of the optical module 100 of Embodiment 2 shown in FIG. 7, a length d1 in the Y-direction between the front surfaces of the first mounting section 25 and the second mounting section 26 that corresponds to the depth of the recess 65 of the carrier 5 is longer, and the thicknesses of the resin bonding materials 7 and 8 are larger, as compared with the optical module 100 of Embodiment 1 shown in FIG. 1. In this way above, the first example of the optical module 100 of Embodiment 2 shown in FIG. 7 achieves the second optical coupling efficiency setting condition while using the resin bonding materials 7 and 8 having the same thicknesses. First, the positions of the semiconductor laser 1 and the optical receiver 12 and the optical coupling efficiency between the semiconductor laser 1 and the optical receiver 12 will be described.

FIG. 8 shows the positions of the semiconductor laser 1 and the light receiving element 2 in the Y-direction when the exposure time is 0, that is, at the initial time, and the beam cross section 34 of the monitor light 17 on the light receiving surface 37 in this case is shown in FIG. 10. FIG. 9 shows the positions of the semiconductor laser 1 and the light receiving element 2 in the Y-direction when the exposure time is t1 or more, that is, when the reference time has elapsed, and FIG. 10 shows the beam cross section 34a of the monitor light 17 on the light receiving surface 37 in this case. Note that the light receiving element after the reference time has elapsed is assigned with a reference sign 2a. The light receiving portion 32 on the side of the light receiving surface 37 at the initial time is shown with the broken line and a reference sign 36 is assigned thereto. A length with which the initial position of the light receiving element 2 is offset to the positive side in the Y-direction is an offset length Lm shown in FIG. 9. In FIG. 10, the beam cross sections 34 and 34a include a light receiving portion central axis 33 and are located on the side of the light receiving portion end 35b side on the negative side in the Y-direction. As the exposure time elapses, the resin bonding material 7 that fixes the light receiving element 2 and the carrier 5 undergoes the thermosetting shrinkage, and the light receiving element 2 moves to the negative side in the Y-direction, so that the monitor light 17 moves to the positive side in the Y-direction on the light receiving surface 37 of the light receiving element 2. Since the area of the beam cross section 34 on the light receiving surface 37 is smaller than the area of the beam cross section 34a on the light receiving surface 37 and the light receiving area of the monitor light 17 received on the light receiving surface 37 increases with the elapse of the exposure time, the optical coupling efficiency between the semiconductor laser 1 and the light receiving element 2 increases with the elapse of the exposure time. Thus, the monitor current Im of the light receiving element 2 increases with the elapse of the exposure time.

The optical coupling efficiency characteristic 43 shown in FIG. 11 indicates the relationship between the optical coupling efficiency between the semiconductor laser 1 and the optical receiver 12, and the exposure time. The horizontal axis is the exposure time of exposure to environmental temperature higher than room temperature, that is, the exposure time, and the vertical axis is the optical coupling efficiency. In the optical coupling efficiency characteristic 43, the optical coupling efficiency increases as the exposure time elapses, and the change trend in the characteristic is an increasing trend. The optical coupling efficiencies at the exposure time of 0 and at t1 are e5 and e6, respectively. As appropriate, the optical coupling efficiency for the semiconductor laser 1 and the light receiving element 2 is referred to as the optical coupling efficiency between the semiconductor laser 1 and the light receiving element 2, and the optical coupling efficiency for the semiconductor laser 1 and the optical fiber 4 is referred to as the optical coupling efficiency between the semiconductor laser 1 and the optical fiber 4.

Next, the positions of the lens 3 and the optical fiber 4, and the optical coupling between the semiconductor laser 1 and the optical fiber 4 will be described. FIG. 7 shows an example in which, when the exposure time is 0, that is, at the initial time, the emission light 16 passes through the lens central axis of the lens 3 and is incident on the optical fiber 4 on the positive side in the Y-direction with respect to the central axis 15 of the optical fiber 4, and when the exposure time is t1 or more, that is, when the reference time has elapsed, the emission light 16 passes through on the positive side in the Y-direction with respect to the lens central axis of the lens 3 and is incident on the optical fiber 4 on the side of the central axis 15 of the optical fiber 4. Note that the emission light and the lens after the reference time has elapsed are assigned with reference signs 16a and 3a, respectively, and a part of the tip end part of the optical fiber 4 at the initial time is shown with a broken line and assigned a sign 4s there to. The length with which the initial position of the tip end part of the optical fiber 4 is offset to the negative side in the Y-direction is an offset length Lf shown in FIG. 7.

An optical coupling efficiency characteristic 44 shown in FIG. 12 indicates the relationship between the optical coupling efficiency between the semiconductor laser 1 and the optical fiber 4, and the exposure time. The horizontal axis is the time of exposure to environmental temperature higher than room temperature, that is, the exposure time, and the vertical axis is the optical coupling efficiency. In the optical coupling efficiency characteristic 44, the optical coupling efficiency increases as the exposure time elapses, and the change trend in the characteristic is an increasing trend. The optical coupling efficiencies at the exposure time of 0 and at t1 are e7 and e8, respectively.

The optical coupling efficiency characteristic 44 shown in FIG. 12 is a first example of the optical coupling efficiency characteristic between the semiconductor laser 1 and the optical fiber 4, and is an example in which the optical coupling efficiency characteristic continues to be in an increasing trend up to the reference time t1. However, the optical coupling efficiency characteristic between the semiconductor laser 1 and the optical fiber 4 is not limited to this. When the optical coupling efficiency characteristic has a peak to be reached in the middle of the time to the reference time t1, the change may end and the optical coupling efficiency characteristic may have a constant value. An optical coupling efficiency characteristic 45a shown in FIG. 13 is a second example of the optical coupling efficiency characteristic between the semiconductor laser 1 and the optical fiber 4, and is an example in which the optical coupling efficiency continues to be in an increasing trend up to an exposure time ta to reach e8, and then reaches a maximum optical coupling efficiency of eh at an exposure time tp, and at the reference time t1 of the exposure time, the optical coupling efficiency reaches e9 that is lower than e8. The optical coupling efficiency characteristic 45b shown in FIG. 14 is a third example of the optical coupling efficiency characteristic between the semiconductor laser 1 and the optical fiber 4, and is an example in which the optical coupling efficiency reaches e8 at the exposure time ta, and continues to be in an increasing trend up to an exposure time tb to reach the optical coupling efficiency of e10, and then the optical coupling efficiency of e10 continues up to the reference time t1 of the exposure time. In FIG. 13 and FIG. 14, the optical coupling efficiency at the exposure time of 0 is e7.

The optical coupling efficiency characteristic 45a having the peak shown in FIG. 13 is an optical coupling efficiency characteristic generated in the case where the resin bonding material 8 undergoes the thermosetting shrinkage even when the exposure time reaches the reference time t1 and the emission light 16a is incident on the optical fiber 4 on the negative side in the Y-direction with respect to the central axis 15. The optical coupling efficiency characteristic 45b shown in FIG. 14 is an example in which the thermosetting shrinkage of the resin bonding material 8 is completed when the exposure time reaches tb. In this case, in the optical module 100 of Embodiment 2, the automatic optical power control is performed, and the initial positions with respect to the reference as the rear surface 24 of the carrier 5 in the light receiving element 2 serving as the optical receiver 12 and the lens 3, which move toward the front surface side of the carrier 5 with the elapse of the exposure time, are determined such that the change trends of the first optical coupling efficiency characteristic and the second optical coupling efficiency characteristic are to be the same in a certain period of time from the initial time. Therefore, the fluctuation of the optical output can be suppressed even if the irreversible compound relative positional deviation due to the high temperature environment occurs between the semiconductor laser 1 and the optical fiber 4.

In the same way, in the case where the optical coupling efficiency characteristic between the semiconductor laser 1 and the optical receiver 12, when the optical coupling efficiency characteristic has a peak to be reached in the middle of the time to the reference time t1, the change may end and the optical coupling efficiency characteristic may have a constant value. The beam cross sectional area of the monitor light 17 shown in FIG. 10 becomes large in the case where the optical coupling efficiency reaches the peak, and at the initial time, the monitor light 17 is in a case of a position to include the light receiving portion end 35b of the light receiving surface 37, and when the exposure time reaches the reference time t1, the monitor light 17 is in a case of a position to include the light receiving portion end 35a of the light receiving surface 37. In the case where the change in the optical coupling efficiency ends and the efficiency becomes constant, the beam cross sectional area of the monitor light 17 on the light receiving surface 37 is equal to the area of the beam cross section 34a of FIG. 10 when the exposure time reaches tb, and the thermosetting shrinkage of the resin bonding material 7 is completed with the beam cross sectional area being completely within the light receiving surface 37. In this case, since the optical coupling efficiency between the semiconductor laser 1 and the optical fiber 4 and the optical coupling efficiency between the semiconductor laser 1 and the light receiving element 2 change in the same way with the exposure time, the first optical coupling efficiency characteristic and the second optical coupling efficiency characteristic have the same change trend. Accordingly, in the optical module 100 of Embodiment 2, the automatic optical power control is performed, and the initial positions with respect to the reference as the rear surface 24 of the carrier 5 in the light receiving element 2 serving as the optical receiver 12 and the lens 3, which move toward the front surface side of the carrier 5 with the elapse of the exposure time, are determined such that the change trends of the first optical coupling efficiency characteristic and the second optical coupling efficiency characteristic are to be the same. Therefore, the fluctuation of the optical output can be suppressed even if the irreversible compound relative positional deviation due to the high temperature environment occurs between the semiconductor laser 1 and the optical fiber 4.

Although the first example of the optical module 100 of Embodiment 2 shown in FIG. 7 is an example in which the initial position of the optical fiber 4 is offset to the negative side in the Y-direction, the initial position of the lens 3 may be offset to the positive side in the Y-direction as shown in FIG. 15 instead of the offset of the optical fiber 4. In the second example of the optical module 100 of Embodiment 2 shown in FIG. 15, the position of the lens 3 is offset to the positive side in the Y-direction and the initial position of the light receiving element 2 is offset to the positive side in the Y-direction as compared with the optical module 100 of Embodiment 1 shown in FIG. 1. Further, in the second example of the optical module 100 of Embodiment 2 shown in FIG. 15, the length d1 in the Y-direction between the front surfaces of the first mounting section 25 and the second mounting section 26, which corresponds to the depth of the recess 65 of the carrier 5, is shorter, and the thicknesses of the resin bonding members 7 and 8 are larger, as compared with the optical module 100 of Embodiment 1 shown in FIG. 1. In this way, the second example of the optical module 100 of Embodiment 2 shown in FIG. 15 achieves the second optical coupling efficiency setting condition while using the resin bonding material 7 and the resin bonding material 8 having the same thickness.

The positions of the semiconductor laser 1 and the optical receiver 12 and the optical coupling efficiency between the semiconductor laser 1 and the optical receiver 12 are the same as those in the first example of the optical module 100 of Embodiment 2 shown in FIG. 7. The positions of the lens 3 and the optical fiber 4, and the optical coupling efficiency between the semiconductor laser 1 and the optical fiber 4 will be described. For example, FIG. 16 shows an example in which the emission light 16 passes through the lens on the negative side in the Y-direction with respect to the lens central axis 13 of the lens 3 and is incident on the optical fiber on the positive side in the Y-direction with respect to the central axis 15 of the optical fiber 4 at the initial time, that is, when the exposure time is 0, and the emission light 16 passes through the lens in the lens central axis 13 of the lens 3 thereof and is incident on the optical fiber in the central axis 15 of the optical fiber 4 thereof when the exposure time is t1 or more, that is, when the reference time has elapsed. Note that the emission light, lens, and lens central axis after the reference time has elapsed are assigned with reference signs 16a, 3a, and 13a. The length with which the initial position of the lens 3 is offset to the positive side in the Y-direction is an offset length Lr shown in FIG. 16. The optical coupling efficiency between the semiconductor laser 1 and the optical fiber 4 is the same as that of the first example of the optical module 100 of Embodiment 2 shown in FIG. 7.

In the optical module 100 of Embodiment 2, the initial positions in the semiconductor laser 1, the tip end part of the optical fiber 4, the lens 3, and the light receiving element 2 serving as the optical receiver 12 with respect to the reference as the rear surface 24 of the carrier 5 are determined such that the change trends of the first optical coupling efficiency characteristic and the second optical coupling efficiency characteristic are to be the same with the elapse of the exposure time; for example, the change trends are to be the same increasing trend in a certain period of time from the initial time. Therefore, when the automatic optical power control is performed on the semiconductor laser 1, the control circuit 20 decreases the injection current Iop of the semiconductor laser 1 as the exposure time elapses in order to keep the monitor current Im at a predetermined set value; that is, the injection current Iop decreases over time. Therefore, in the optical module 100 of Embodiment 2, since an increase in the light amount of the emission light 16, that is, an increase in the optical power is suppressed even if the optical coupling efficiency between the semiconductor laser 1 and the optical fiber 4 is increased with the elapse of the exposure time, an increase in the introduced light amount of the emission light 16 to the optical fiber 4, that is, an increase in the introduced optical power, can be suppressed. Thus, the optical module 100 of Embodiment 2 can suppress the fluctuation of the optical output even if the optical coupling efficiency between the semiconductor laser 1 and the optical fiber 4 changes owing to the compound relative positional deviation that occurs between the semiconductor laser 1 and the optical fiber 4 with the elapse of the exposure time.

Embodiment 3

Figure 17:
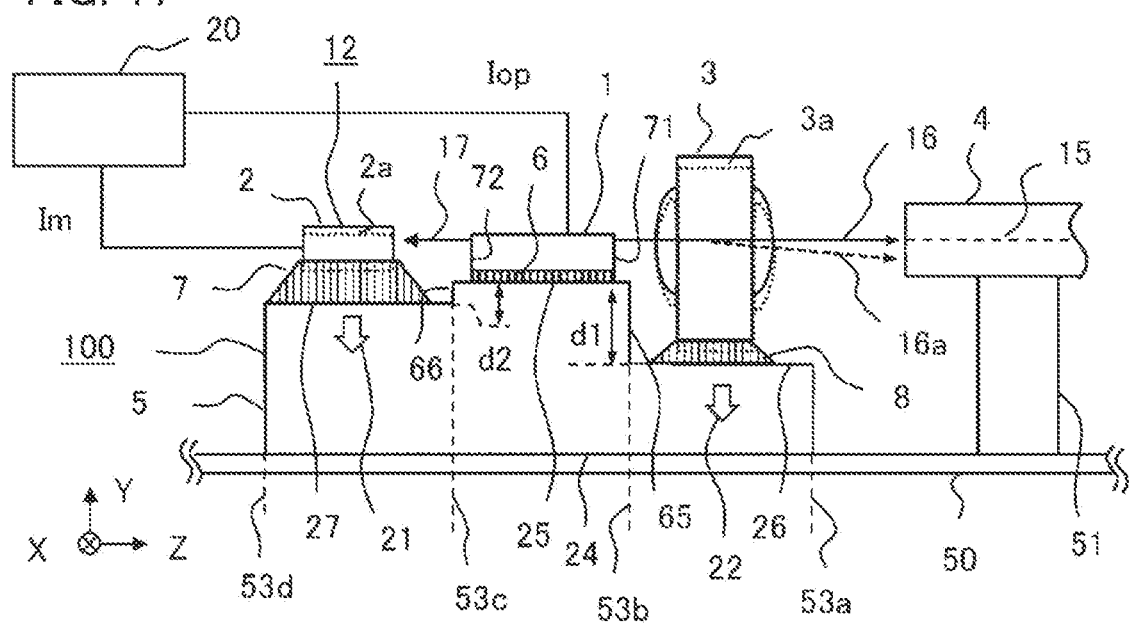
FIG. 17 is a diagram showing a first example of an optical module according to Embodiment 3.
Figure 18:
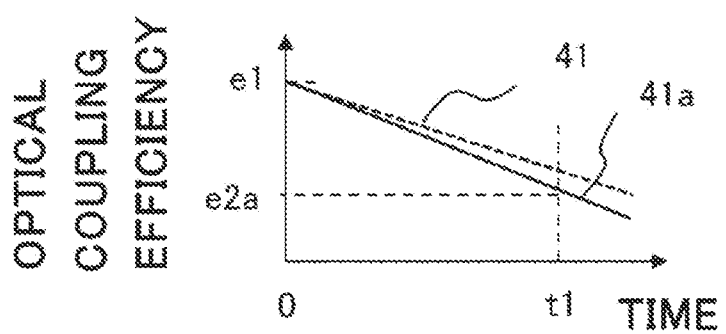
FIG. 18 is a diagram showing an optical coupling efficiency characteristic between a semiconductor laser and a light receiving element in FIG. 17.
Figure 19:
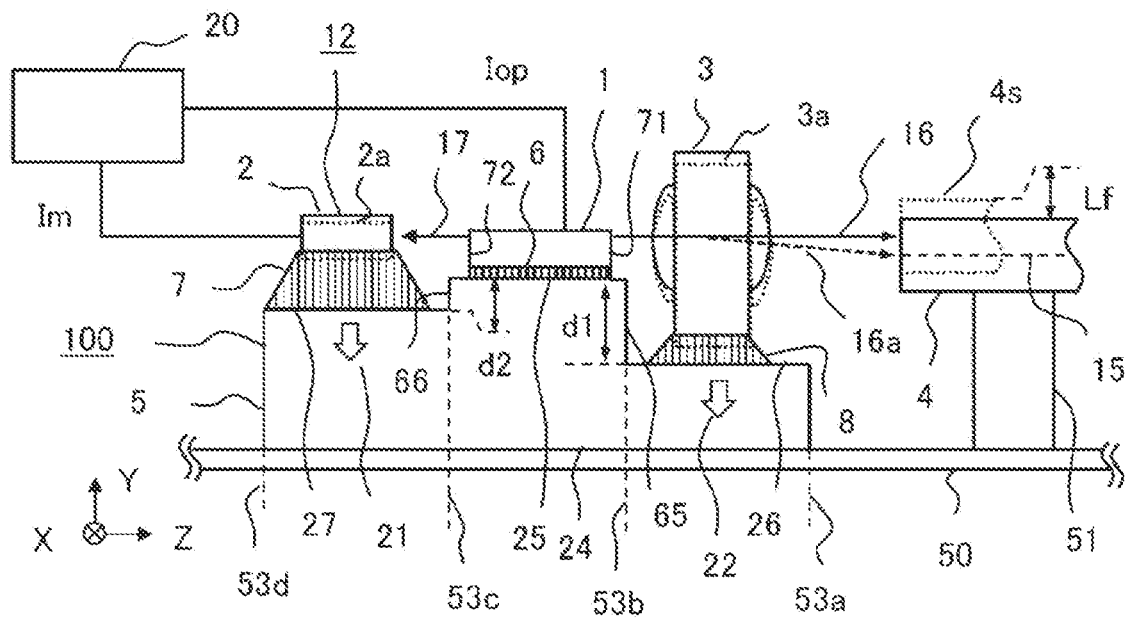
FIG. 19 is a diagram showing a second example of the optical module according to Embodiment 3.
Figure 20:
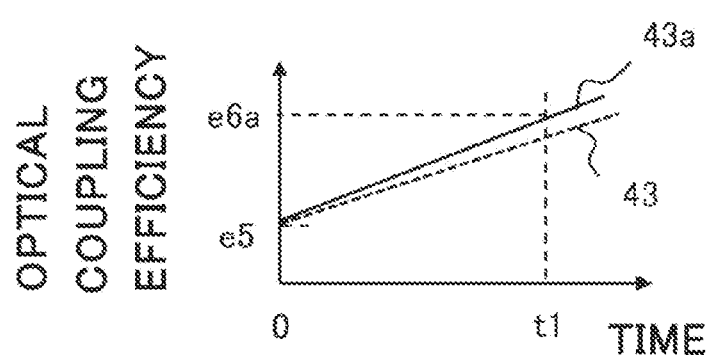
FIG. 20 is a diagram showing an optical coupling efficiency characteristic between the semiconductor laser shown and the light receiving element in FIG. 19.

FIG. 17 is a diagram showing a first example of an optical module according to Embodiment 3, and FIG. 18 is a diagram showing an optical coupling efficiency characteristic between a semiconductor laser and a light receiving element in FIG. 17. FIG. 19 is a diagram showing a second example of the optical module according to Embodiment 3, and FIG. 20 is a diagram showing an optical coupling efficiency characteristic between the semiconductor laser and the light receiving element in FIG. 19. The optical module 100 of Embodiment 3 differs from the optical modules 100 of Embodiment 1 and Embodiment 2 in that the amount of thermosetting shrinkage of the resin bonding material 7 is larger than the amount of thermosetting shrinkage of the resin bonding material 8 with the elapse of exposure time. The different parts from the optical modules 100 of Embodiment 1 and Embodiment 2 will be mainly described.

In general, a single mode fiber is used as the optical fiber 4, and the mode field diameter (full width) is about 10 μm in the case of light having a wave length of 1.5 μm. On the other hand, the area or the light receiving diameter of the light receiving surface of the light receiving element 2 is often wider than the mode field diameter of the optical fiber 4. In addition, since the emission light 16 of the semiconductor laser 1 introduced into the optical fiber 4 is condensed by the lens 3, but the monitor light 17 of the semiconductor laser 1 introduced into the light receiving element 2 does not pass through the lens, the beam diameter is wider than that of the emission light 16 condensed by the lens 3. The beam cross section of the monitor light 17 at the light receiving surface 37 of the light receiving element 2 is larger than the beam cross section of the emission light 16 at the end face of the optical fiber 4 on the lens 3 side. When the monitor light 17 and the emission light 16 travel the same distance, the amount of change in the beam cross sectional area when the monitor light 17 on the light receiving surface 37 passes the light receiving portion end 35a or the light receiving portion end 35b is smaller than the amount of change in the beam cross sectional area of the condensed emission light 16 on the end face of the optical fiber 4, and thus the change in the optical coupling efficiency at the light receiving element 2 is smaller than the change in the optical coupling efficiency at the optical fiber 4.

When the automatic optical power control is performed by the control circuit 20, an correction amount of the optical power of the optical module 100 is to be larger as the change in the optical coupling efficiency of the light receiving element 2 is to be large. Therefore, in Embodiment 3, the amount of thermosetting shrinkage with the elapse of the exposure time in the resin bonding material 7 for fixing the light receiving element 2 is made larger than that of the resin bonding material 8 for fixing the lens 3, so that the correction amount of the optical output when the automatic optical power control is performed is made larger. The increase in the change in the optical coupling efficiency at the light receiving element 2 means an increase in the detection sensitivity of the compound relative positional deviation between the semiconductor laser 1 and the optical fiber 4 with the elapse of the exposure time. The correction amount of the optical output of the same time that is large corresponds to a large correction speed of the optical coupling efficiency associated with the compound relative positional deviation between the semiconductor laser 1 and the optical fiber 4 with the lapse of the exposure time. Therefore, the optical module 100 of Embodiment 3 can suppress the fluctuation of the optical output in a smaller fluctuation width than that of the optical module 100 of Embodiment 1 and Embodiment 2. To make the amount of thermosetting shrinkage of the resin bonding material 7 with the elapse of the exposure time larger than the amount of thermosetting shrinkage of the resin bonding material 8, the following method can be used. For example, as the first setting method for the thickness of the resin bonding material in the case where the resin bonding material 7 and the resin bonding material 8 are the same material, the thickness of the resin bonding material 7 may be made larger than that of the resin bonding material 8. In this case, the resin bonding material 7 with a larger volume has a larger amount of thermosetting shrinkage than the resin bonding material 8.

As the second setting method for the thickness of the resin bonding material, when the resin bonding materials 7 and 8 have such a property that the amount of thermosetting shrinkage is saturated with the elapse of the exposure time, the thermosetting shrinkage of only the resin bonding material 8 may be allowed to proceed in advance. Also in this case, when the exposure time of the optical module 100 is 0, the thickness of the resin bonding material 7 is larger than the thickness of the resin bonding material 8. In the second setting method for the thickness of the resin bonding material, for example, in the manufacturing process of the optical module 100, only the lens 3 is fixed with the resin bonding material 8 while the light receiving element 2 is not fixed, and the carrier 5 in the middle of manufacturing on which the semiconductor laser 1 and the lens 3 are mounted is exposed to the high temperature environment. This allows the thermosetting shrinkage of only the resin bonding material 8 to proceed in advance. After that, the light receiving element 2 is fixed on the carrier 5 by using the resin bonding material 7. In this case, the thickness of the resin bonding material 7 can be made larger than the thickness of the resin bonding material 8 in accordance with the difference in the degree of progress of the thermosetting shrinkage between the resin bonding material 7 and the resin bonding material 8.

As the third setting method for the thickness of the resin bonding material, different materials may be used for the resin bonding material 7 and the resin bonding material 8 to set a difference in the amount of thermosetting shrinkage.

The first example of the optical module 100 of Embodiment 3 shown in FIG. 17 is an example in which the resin bonding material 7 and the resin bonding material 8 having different thicknesses are applied to the optical module 100 of Embodiment 1, which differs from the optical module 100 of Embodiment 1 shown in FIG. 1 in that the thickness of the resin bonding material 7 in the Y-direction is larger than the thickness of the resin bonding material 8 in the Y-direction, and the light receiving element 2 is fixed on the front surface of the third mounting section 27 corresponding to the bottom surface opposite to the rear surface 24 in a recess 66 provided in the carrier 5. The second example of the optical module 100 of Embodiment 3 shown in FIG. 19 is an example in which the resin bonding material 7 and the resin bonding material 8 having different thicknesses are applied to the first example of the optical module 100 of Embodiment 2, which differs from the first example of the optical module 100 of Embodiment 2 shown in FIG. 7 in that the thickness of the resin bonding material 7 in the Y-direction is larger than the thickness of the resin bonding material 8 in the Y-direction, and the light receiving element 2 is fixed on the front surface of the third mounting section 27 corresponding to the bottom surface opposite to the rear surface 24 in the recess 66 provided in the carrier 5.

First, the first example of the optical module 100 of Embodiment 3 shown in FIG. 17 will be described. The third mounting section 27 is the portion corresponding to the recess 66 formed on the front side of the carrier 5, and the front surface of the third mounting section 27 corresponds to the bottom surface of the recess 66 opposite to the rear surface 24. A length d2 between the front surface of the first mounting section 25 and the front surface of the third mounting section 27 in the Y-direction corresponds to the depth of the recess 66. An optical coupling efficiency characteristic 41a shown in FIG. 18 indicates the relationship between the optical coupling efficiency between the semiconductor laser 1 and the light receiving element 2 serving as the optical receiver 12, and the exposure time. Note that the optical coupling efficiency characteristic 41, which is the characteristic of the optical coupling efficiency between the semiconductor laser 1 and the light receiving element 2 serving as the optical receiver 12 in the optical module 100 of Embodiment 1, is indicated by a broken line. The horizontal axis is the time of exposure to environmental temperature higher than room temperature, that is, the exposure time, and the vertical axis is the optical coupling efficiency. In the optical coupling efficiency characteristic 41a, the optical coupling efficiency decreases with the elapse of the exposure time, and the change trend in the characteristic is a decreasing trend. The optical coupling efficiency characteristic 41a has a steeper decreasing slope of the change than the optical coupling efficiency characteristic 41. The optical coupling efficiency at exposure time 0 is e1, and the optical coupling efficiency at exposure time t1 is e2a, which is smaller than e2.

Next, the second example of the optical module 100 of Embodiment 3 shown in FIG. 19 will be described. The third mounting section 27, the recess 66 in which the light receiving element 2 is fixed are the same as that in the first example of the optical module 100 of Embodiment 3 shown in FIG. 17. An optical coupling efficiency characteristic 43a shown in FIG. 20 indicates the relationship between the optical coupling efficiency between the semiconductor laser 1 and the light receiving element 2 serving as the optical receiver 12, and the exposure time. Note that the optical coupling efficiency characteristic 43, which is the characteristic of the optical coupling efficiency between the semiconductor laser 1 and the light receiving element 2 serving as the optical receiver 12 in the optical module 100 of Embodiment 2, is indicated by a broken line. The horizontal axis is the time of exposure to environmental temperature higher than room temperature, that is, the exposure time, and the vertical axis is the optical coupling efficiency. In the optical coupling efficiency characteristic 43a, the optical coupling efficiency increases with the elapse of the exposure time, and the change trend in the characteristic is an increasing trend. The optical coupling efficiency characteristic 43a has a steeper increasing slope of the change than the optical coupling efficiency characteristic 43. The optical coupling efficiency at the exposure time 0 is e5, and the optical coupling efficiency at the exposure time t1 is e6a, which is smaller than e6. Note that, as shown in FIG. 13 and FIG. 14, when the optical coupling efficiency characteristic 43a has a peak to be reached in the middle of the time to the reference time t1, the change may end and the optical coupling efficiency characteristic may have a constant value.

Embodiment 4

Figure 21:
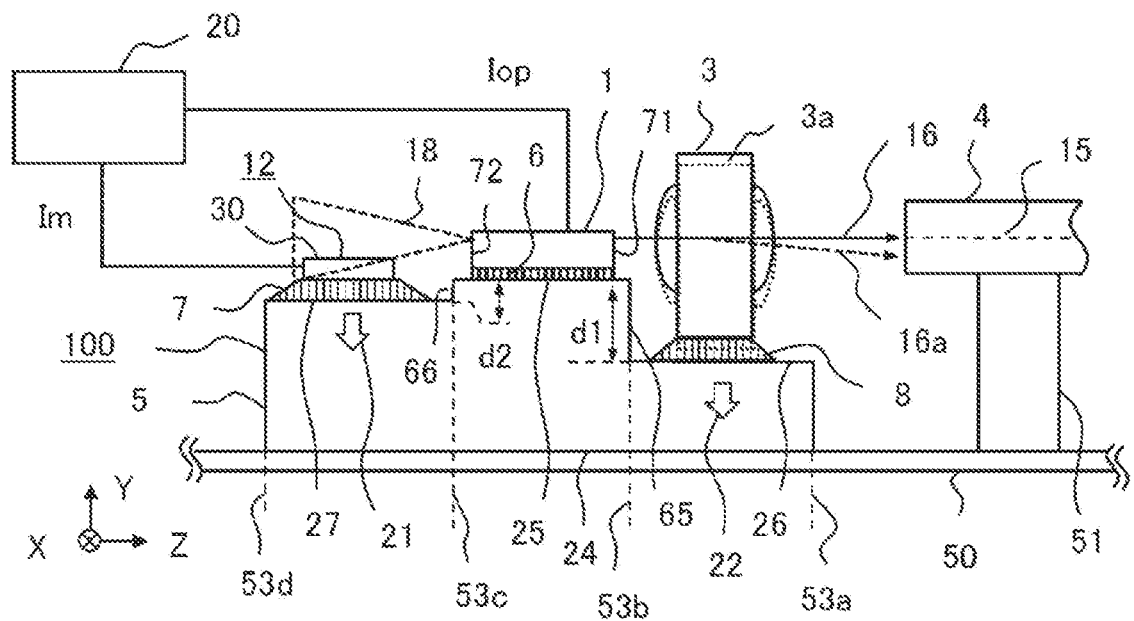
FIG. 21 is a diagram showing an optical module according to Embodiment 4.
Figure 22:
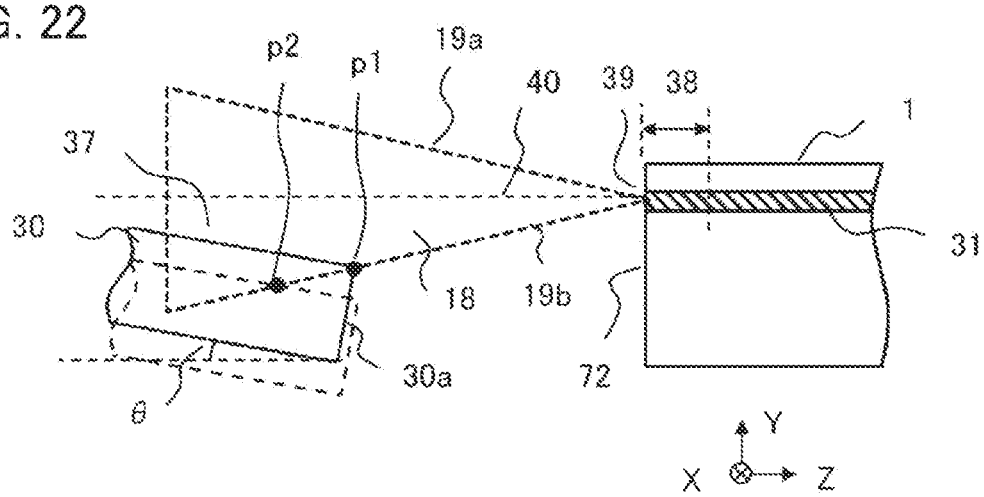
FIG. 22 is a diagram showing positional changes of a light receiving element in FIG. 21 and a light receiving limit point of monitor light.
Figure 23:
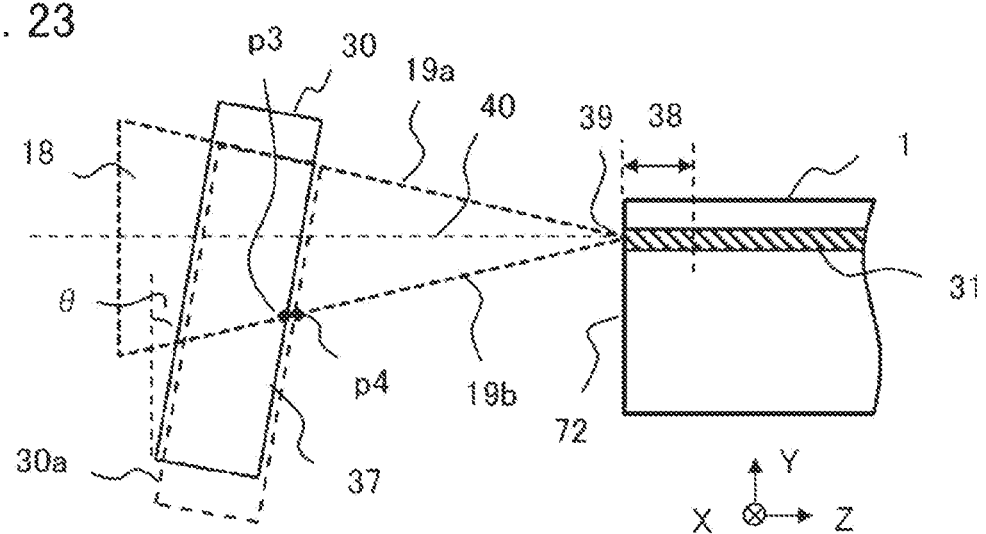
FIG. 23 is a diagram showing positional changes of a light receiving element and a light receiving limit point of monitor light according to a comparative example.

FIG. 21 is a diagram showing an optical module according to Embodiment 4. FIG. 22 is a diagram showing a positional change of a light receiving limit point in a light receiving element in FIG. 21 and monitor light, and FIG. 23 is a diagram showing a positional change of the light receiving limit point of a light receiving element and monitor light according to a comparative example. The optical module 100 of Embodiment 4 differs from the optical module 100 of Embodiment 1 in that the monitor light 17 is changed to monitor light 18 of diffused light, and the monitor light 18 is received by a light receiving element 30 of a surface type. The different parts from the optical module 100 of Embodiment 1 will be mainly described.

The light receiving surface 37 of the light receiving element 30 is arranged on the side of the rear surface 24 of the carrier 5 with respect to the emission portion 39 of the monitor light 18 and does not intersect with the optical axis 40 of the monitor light 18. The semiconductor laser 1 of Embodiment 4 includes a spot-size conversion part 38 for enlarging the spot size of the laser light, for example, on the side of the second end face 72 of the active layer 31, and emits light whose spot size is enlarged more than that of the monitor light 17, that is, the monitor light 18 of the diffused light. FIG. 22 also shows diffused light boundaries 19a and 19b in the Y-direction of the monitor light 18. A diffused light boundary 19a is the boundary on the positive side in the Y-direction, and a diffused light boundary 19b is the boundary on the negative side in the Y-direction. A solid line shows the light receiving element 30 when the exposure time is 0. In FIG. 22, the light receiving element when the exposure time is equal to or greater than the reference time t1 is indicated by a broken line and is assigned with a reference sign 30a. The light receiving surface 37 of the light receiving element 30 is inclined with respect to the Z-axis direction by an angle θ and an example is shown in which the light receiving surface 37 of the light receiving element 30 is arranged so as to face the side of the second end face 72 of the semiconductor laser 1. The angle θ is, for example, 0 to 30 degrees.

When the exposure time is 0, in the monitor light 18, the diffused light boundary 19b passes through the light receiving limit point p1 on the side of the semiconductor laser 1 in the light receiving surface 37 of the light receiving element 30. When the exposure time is equal to or greater than the reference time t1, the diffused light boundary 19b of the monitor light 18 passes through the light receiving limit point p2 on the light receiving surface 37 of the light receiving element 30a, which has moved to the negative side in the Y-direction due to the thermosetting shrinkage of the resin bonding material 7. Therefore, the area of the beam cross section at the light receiving surface 37 in the monitor light 18 received by the light receiving element 30a, that is, the light receiving area, is smaller than the area of the beam cross section at the light receiving surface 37 in the monitor light 18 received by the light receiving element 30, that is, the light receiving area. The beam cross sectional area of the monitor light 18 received by the light receiving element 30 decreases with the elapse of the exposure time. The optical coupling efficiency change characteristic between the semiconductor laser 1 and the optical receiver 12 are similar to that of Embodiment 1.

In the optical module 100 of Embodiment 4, the initial positions in the semiconductor laser 1, the tip part end of the optical fiber 4, the lens 3, and the light receiving element 2 serving as the optical receiver 12 with respect to the reference as the rear surface 24 of the carrier 5 is determined such that the change trends of the first optical coupling efficiency characteristic and the second optical coupling efficiency characteristic are to be the same with the elapse of the exposure time; for example, the change trends are to be the same decreasing trend. Therefore, when the automatic optical power control is performed on the semiconductor laser 1, the fluctuation of the optical output can be suppressed even if the irreversible compound relative positional deviation due to the high temperature environment occurs between the semiconductor laser 1 and the optical fiber 4, as in the optical module 100 of Embodiment 1.

In the optical module 100 of Embodiment 4, the amount of change in the optical coupling efficiency caused by the thermosetting shrinkage of the resin bonding material 7 is larger than that in the comparative example where the light receiving surface 37 is inclined by an angle θ with respect to the Y-axis direction. In the comparative example shown in FIG. 23, when the exposure time is 0, the monitor light 18 has a diffused light boundary 19b passing through the light receiving limit point p3 on the light receiving surface 37 of the light receiving element 30. When the exposure time is equal to or greater than the reference time t1, the diffused light boundary 19b of the monitor light 18 passes the light receiving limit point p4 on the light receiving surface 37 of the light receiving element 30a, which has moved to the negative side in the Y-direction due to the thermosetting shrinkage of the resin bonding material 7, and the diffused light boundary 19a of the monitor light 18 passes the upper limit of the light receiving surface 37 in the Y-direction. Therefore, the beam cross sectional area of the monitor light 18 received at the light receiving element 30a is slightly smaller than that of the monitor light 18 received at the light receiving element 30, and hardly changes. In the optical module 100 of Embodiment 4, with regard to the beam cross sectional area of the monitor light 18 received at the light receiving element 30, the amount of change thereof that decreases with the elapse of exposure time can be made larger than in the comparative example, the amount of change in the optical coupling efficiency can be increased more than in the comparative example. In the optical module 100 of Embodiment 4, since the amount of change in the optical coupling efficiency can be made larger than that in the comparative example, the correction amount of the optical output when the automatic optical power control is performed can be made larger than that in the comparative example. Therefore, the optical module 100 of Embodiment 4 can suppress the fluctuation of the optical output in a smaller fluctuation width than the comparative example.

Embodiment 5

Figure 24:
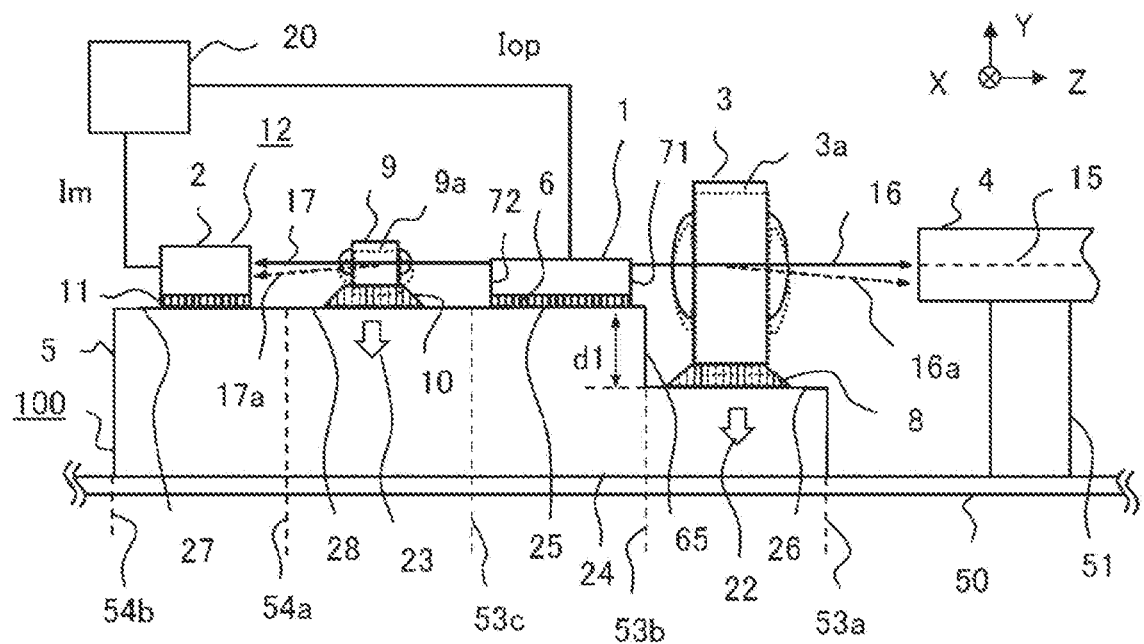
FIG. 24 is a diagram showing an optical module according to Embodiment 5.
Figure 25:
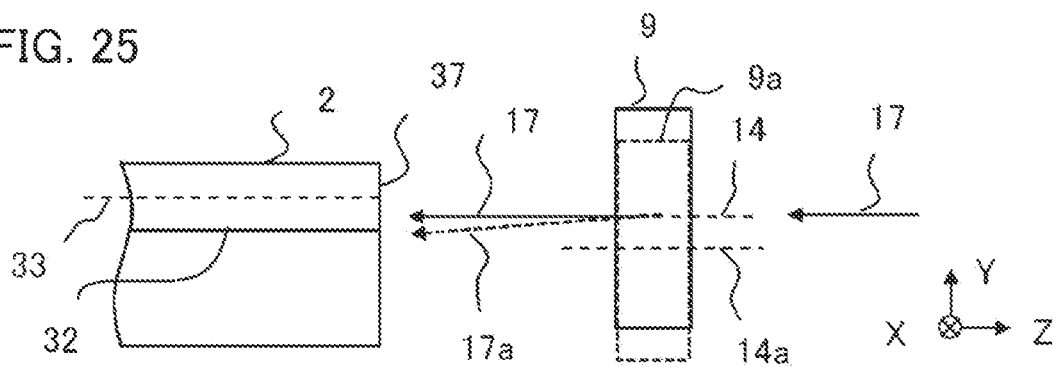
FIG. 25 is a diagram showing positional changes of a lens for monitoring light and the monitor light in FIG. 24.
Figure 26:
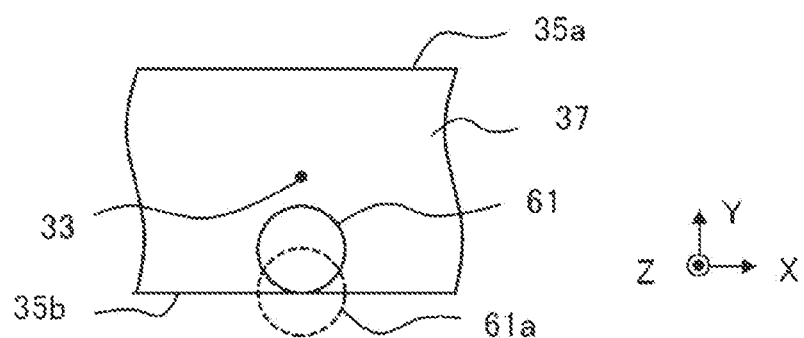
FIG. 26 is a diagram showing monitor light on a light receiving surface of a light receiving element in FIG. 24.
Figure 27:
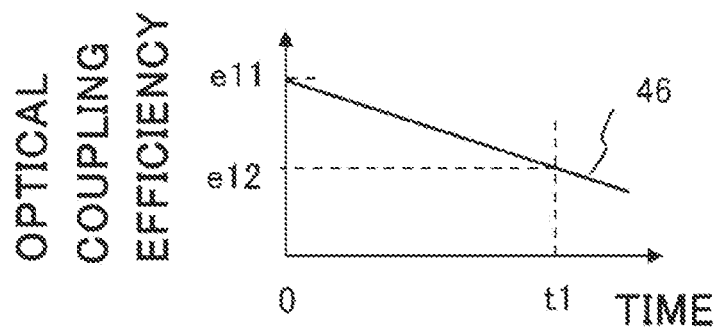
FIG. 27 is a diagram showing an optical coupling efficiency characteristic between a semiconductor laser and the light receiving element according to Embodiment 5.
Figure 28:
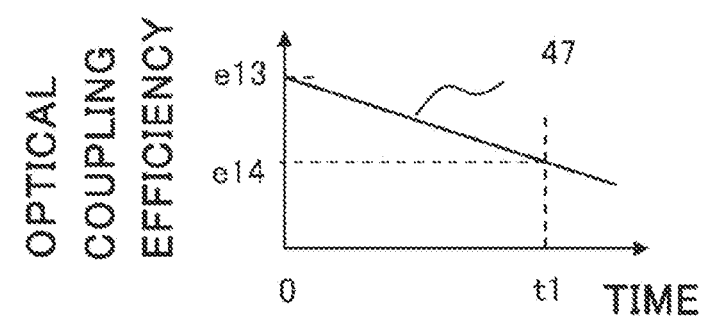
FIG. 28 is a diagram showing an optical coupling efficiency characteristic between the semiconductor laser and an optical fiber according to Embodiment 5.

FIG. 24 is a diagram showing an optical module according to Embodiment 5. FIG. 25 is a diagram showing positional changes of a lens for monitoring light and the monitor light in FIG. 24, and FIG. 26 is a diagram showing the monitor light on the light receiving surface of the light receiving element in FIG. 24. FIG. 27 is a diagram showing an optical coupling efficiency characteristic between a semiconductor laser and a light receiving element according to Embodiment 5, and FIG. 28 is a diagram showing an optical coupling efficiency characteristic between the semiconductor laser and an optical fiber according to Embodiment 5. The optical module 100 of Embodiment 5 differs from the optical module 100 of Embodiment 1 in that the optical receiver 12 includes the light receiving element 2 and a lens 9. The lens 9 is a lens for monitoring light and condenses the monitor light 17. The different parts from the optical module 100 of Embodiment 1 will be mainly described.

The monitor light 17 emitted from the second end face 72 of the semiconductor laser 1 is condensed by the lens 9 and received by the light receiving element 2. The light receiving element 2 is fixed on the front surface of the third mounting section 27 of the carrier 5 with a metal bonding material 11 that does not undergo the thermosetting shrinkage, and the lens 9 is fixed on the front surface of a fourth mounting section 28 of the carrier 5 with a resin bonding material 10 that undergoes the thermosetting shrinkage. The metal bonding material 11 is, for example, solder such as AuSn, SnAg, or SnAgCu, similar to the metal bonding material 6. The resin bonding material 10 is, for example, a bonding material containing acrylic, epoxy, thiol, or the like as a main component, similar to the resin bonding material 8. In the optical module 100 of Embodiment 1, the light receiving element 2 serving as the optical receiver 12 is fixed on the front surface of the third mounting section 27 of the carrier 5 with the resin bonding material 7 that undergoes the thermosetting shrinkage. In contrast, in the optical module 100 of Embodiment 5, the light receiving element 2 that is a part of the optical receiver 12 is fixed on the carrier 5 with the metal bonding material 11 that does not undergo the thermosetting shrinkage, and the lens 9 that is a part of the optical receiver 12 is fixed on the carrier 5 with the resin bonding material 10 that undergoes the thermosetting shrinkage. When the resin bonding material 10 is exposed to the environmental temperature higher than room temperature, the resin bonding material 10 undergoes the thermosetting shrinkage depending on the exposure time of exposure to environmental temperature higher than room temperature, and the thickness thereof in the Y-direction decreases as indicated by an arrow 23.

The lens 9 moves to the front surface side of the fourth mounting section 28 due to the thermosetting shrinkage of the resin bonding material 10, and the lens 3 moves to the front surface side of the second mounting section 26 due to the thermosetting shrinkage of the resin bonding material 8. The lenses 9 and 3 after the elapse of the exposure time are shown as lenses 9a and 3a indicated by broken lines. As the exposure time elapses, the positional relationship in the semiconductor laser 1, the light receiving element 2 and the lens 9 that constitute the optical receiver 12, the lens 3, and the optical fiber 4 with respect to the reference as the rear surface 24 of the carrier 5, that is, the positional relationship thereof in the Y-direction changes. Therefore, in the optical module 100 of Embodiment 5, the optical coupling efficiency between the semiconductor laser 1 and the optical receiver 12 and the optical coupling efficiency between the semiconductor laser 1 and the optical fiber 4 change as in the optical module 100 of Embodiment 1.

The second mounting section 26, the first mounting section 25, the fourth mounting section 28, and the third mounting section 27 are arranged in this order from the side closer to the optical fiber 4. The range from a broken line 53a to a broken line 53b is the second mounting section 26, the range from the broken line 53b to a broken line 53c is the first mounting section 25, the range from the broken line 53c to a broken line 54a is the fourth mounting section 28, and the range from the broken line 54a to a broken line 54b is the third mounting section 27. The second mounting section 26 is a portion corresponding to the recess 65 formed on the front surface side of the carrier 5, and the front surface of the second mounting section 26 corresponds to the bottom surface of the recess 65 opposite to the rear surface 24. The length d1 between the front surface of the first mounting section 25 and the front surface of the second mounting section 26 in the Y-direction corresponds to the depth of the recess 65. The front surface of the first mounting section 25, the front surface of the fourth mounting section 28, and the front surface of the third mounting section 27 are flat surfaces having no height difference.

As described above, the optical coupling efficiencies between the semiconductor laser 1 and the optical receiver 12 and between the semiconductor laser 1 and the optical fiber 4 with respect to the exposure time are referred to as the first optical coupling efficiency characteristic and the second optical coupling efficiency characteristic, respectively. In the optical module 100 of Embodiment 5, the automatic optical power control is performed, and the initial positions with respect to the reference as the rear surface 24 of the carrier 5 in the lens 9 being a part of the optical receiver 12, and the lens 3 that move to the front surface side of the carrier 5 with the elapse of the exposure time are determined such that the change trends of the first optical coupling efficiency characteristic and the second optical coupling efficiency characteristic are to be the same. Therefore, the fluctuation of the optical output can be suppressed even if the irreversible compound relative positional deviation due to the high temperature environment occurs between the semiconductor laser 1 and the optical fiber 4.

FIG. 24 shows an example of the optical module 100 in which the change trends of the first optical coupling efficiency characteristic and the second optical coupling efficiency characteristic are the decreasing trends, that is, the first optical coupling efficiency and the second optical coupling efficiency decrease over time. For the optical module 100 of Embodiment 5 shown in FIG. 24, the initial positions in the semiconductor laser 1, the tip end part of the optical fiber 4, the lens 3, and the light receiving element 2 and the lens 9 that constitute the optical receiver 12 with respect to the reference as the rear surface 24 of the carrier 5 are determined such that the change trends of the first optical coupling efficiency characteristic and the second optical coupling efficiency characteristic are to be the same with the elapse of the exposure time; for example, the change trends are to be the same decreasing trend (the first optical coupling efficiency setting condition described above).

The monitor light 17 emitted from the emission portion 39, which is a region of the active layer 31 of the semiconductor laser 1 on the side of the second end face 72, is condensed by the lens 9, and the condensed light of the monitor light 17 is received by the light receiving portion 32 of the light receiving element 2. FIG. 27 and FIG. 28 show an example of an optical coupling efficiency characteristic between the semiconductor laser 1 and the light receiving element 2 of the optical receiver 12 when the reference time t1 is 2000 hours and an example of an optical coupling efficiency characteristic between the semiconductor laser 1 and the optical fiber 4 when the reference time t1 is 2000 hours, respectively. The horizontal axis is the time of exposure to environmental temperature higher than room temperature, that is, the exposure time, and the vertical axis is the optical coupling efficiency. An optical coupling efficiency characteristic 46 shown in FIG. 27 indicates the relationship between the optical coupling efficiency between the semiconductor laser 1 and the optical receiver 12, and the exposure time. The optical coupling efficiency characteristic 46 decreases with the elapse of the exposure time, and the change trend in the characteristic is a decreasing trend. The optical coupling efficiencies at the exposure time 0 and t1 are e11 and e12, respectively. An optical coupling efficiency characteristic 47 shown in FIG. 28 indicates the relationship between the optical coupling efficiency between the semiconductor laser 1 and the optical fiber 4, and the exposure time. In the optical coupling efficiency characteristic 47, the optical coupling efficiency decreases with the elapse of the exposure time, and the change trend in the characteristic is a decreasing trend. The optical coupling efficiencies at the exposure time 0 and t 1 are e 13 and e 14, respectively.

The change in the optical coupling efficiency between the semiconductor laser 1 and the optical fiber 4 associated with the positions of the semiconductor laser 1 and the optical fiber 4 is the same as in Embodiment 1, and the explanation will not be repeated. The change in the optical coupling efficiency between the semiconductor laser 1 and the optical receiver 12 associated with the positions of the semiconductor laser 1 and the optical receiver 12 will be explained.

FIG. 25 shows the positions of the lens 9 and the light receiving element 2 in the Y-direction when the exposure time is 0, that is, at the initial time, and FIG. 26 shows a beam cross section 61 of the monitor light 17 condensed on the light receiving surface 37 in this case. FIG. 25 shows the positions of the lens 9a and the light receiving element 2 in the Y-direction when the exposure time is t1 or more, that is, when the reference time has elapsed, and FIG. 26 shows a beam cross section 61a of the monitor light 17 condensed on the light receiving surface 37 in this case. Since the monitor light 17 is condensed, the beam cross sectional area is smaller than that in FIG. 4 of Embodiment 1. In addition, FIG. 24 to FIG. 26 show an example in which the monitor light 17 on the light receiving surface 37 moves to the negative side in the Y-direction in accordance with the movement of the lens 9 to the negative side in the Y-direction.

The optical coupling efficiency between the semiconductor laser 1 and the optical receiver 12 varies in accordance with an increase or decrease in the beam cross sectional area of the monitor light 17 incident on the light receiving surface 37, that is, the light receiving area. When the exposure time is 0, the monitor light 17 travels straight to the negative side in the Z-direction along a lens central axis 14 of the lens 9 and reaches the position of the beam cross section 61 in contact with the light receiving portion end 35b of the light receiving surface 37, for example. When the exposure time is t1 or more, the monitor light 17 passes through the positive side in the Y-direction from a lens central axis 14a of the lens 9a that is the lens 9 after the movement to the negative side in the Y-direction, so that monitor light 17a traveling to the negative side in the Y-direction as the monitor light 17 is incident on the light receiving surface 37 of the light receiving element 2 of the optical receiver 12. The beam cross section 61a of the monitor light 17a on the light receiving surface 37 is moved to the negative side in the Y-direction so as to include the light receiving portion end 35b. The area of the beam cross section 61 on the light receiving surface 37 is larger than the area of the beam cross section 61a on the light receiving surface 37, and the light receiving area decreases with the elapse of the exposure time, so that the optical coupling efficiency between the semiconductor laser 1 and the light receiving element 2 decreases with the elapse of the exposure time.

In the optical module 100 of Embodiment 5, similar to the emission light 16 of the semiconductor laser 1 introduced into the optical fiber 4, the monitor light 17 of the semiconductor laser 1 introduced into the light receiving element 2 can also be condensed by the lens 9. Therefore, the amount of change in the optical coupling efficiency between the semiconductor laser 1 and the light receiving element 2 caused by the thermosetting shrinkage of the resin bonding material 10 is easy to be made larger than that of the optical module 100 of Embodiment 1 in which the optical receiver 12 is not provided with the lens 9. This is because when the area of the beam cross section on the light receiving surface 37 is small, the ratio of the area that deviates from the light receiving surface 37 is larger than that when the area of the beam cross section is large, even if the travel distance in the Y-direction is the same. Therefore, it is easy to design the optical module such that the amount of decrease in the optical coupling efficiency between the semiconductor laser 1 and the light receiving element 2 due to the elapse of the exposure time in the high temperature environment is equal to the amount of decrease in the optical coupling efficiency between the semiconductor laser 1 and the optical fiber 4.

In the optical module 100 of Embodiment 5, when the automatic optical power control is performed, since the change in the optical coupling efficiency in the light receiving element 2 is larger than that in the optical module 100 of Embodiment 1, so that the correction amount of the optical output of the optical module 100 is to be larger. As described in Embodiment 3, the optical module 100 of Embodiment 5 can increase the detection sensitivity of the compound relative positional deviation between the semiconductor laser 1 and the optical fiber 4 with the elapse of the exposure time as compared with the optical module 100 of Embodiment 1, and can increase the correction speed of the optical coupling efficiency associated with the compound relative positional deviation between the semiconductor laser 1 and the optical fiber 4 with the elapse of the exposure time. Therefore, the optical module 100 of Embodiment 5 can suppress the fluctuation of the optical output in a smaller fluctuation width than the optical module 100 in Embodiment 1.

For example, if the following conditions are satisfied, the amount of change in the optical coupling efficiency in the light receiving element 2 can be sufficiently large, and the design can be made such that the amount of change in the optical coupling efficiency between the semiconductor laser 1 and the light receiving element 2 is equal to the amount of change in the optical coupling efficiency between the semiconductor laser 1 and the optical fiber 4. The first condition is that the beam diameter of the monitor light 17 impinging on the light receiving element 2, that is, the diameter of the beam cross section 61 or 61a, is substantially equal to the beam diameter impinging on the optical fiber 4. The second condition is that the size of the light receiving surface 37 of the light receiving portion 32 of the light receiving element 2 is substantially equal to the size of an optical coupling portion of the optical fiber 4. When the optical fiber 4 has a core and a cladding having different refractive indexes, the size of the optical coupling portion is the size of the core. The optical module 100 of Embodiment 5 is an example satisfying the first condition.

In the optical module 100 of Embodiment 5, since the semiconductor laser 1 and the light receiving element 2 are fixed on the carrier 5 with the metal bonding materials 6 and 11, and it is difficult to finely adjust the optical coupling efficiency between the semiconductor laser 1 and the light receiving element 2, the optical coupling efficiency between the semiconductor laser 1 and the light receiving element 2 is set to be at its maximum, for example, by setting the thickness, etc. of the resin bonding material 10 for the lens 9. FIG. 24 illustrates an example in which the thickness of the resin bonding material 8 in the Y-direction is equal to the thickness of the resin bonding material 10 in the Y-direction. When the resin bonding material 8 for the lens 3 and the resin bonding material 10 for the lens 9 are made from the same material, if the optical coupling efficiency between the semiconductor laser 1 and the optical fiber 4 is set in the same way as the optical module 100 of Embodiment 1 and the first condition or the second condition described above is satisfied, the amount of decrease in the optical coupling efficiency between the semiconductor laser 1 and the light receiving element 2 and the amount of decrease in the optical coupling efficiency between the semiconductor laser 1 and the optical fiber 4 with the elapse of the exposure time in the high temperature environment can be made to be equal.

In the optical module 100 of Embodiment 5, the semiconductor laser 1 and the light receiving element 2 are fixed on the carrier 5 with the metal bonding materials 6 and 11 at the same time, and the lens 3 and the lens 9 are fixed on the carrier 5 with the resin bonding materials 8 and 10 at the same time. Therefore, the fixing time for the optical receiver 12 can be shortened as compared with the optical module 100 of Embodiment 1. Many typical resin bonding materials require UV light irradiation for tens of seconds to several minutes for the fixing, but fixing by soldering takes only a few seconds. In the optical module 100 of Embodiment 5, since the light receiving element 2 is fixed on the carrier 5 with the metal bonding material 11, the heat dissipation of the light receiving element 2 can be improved as compared with the optical module 100 of Embodiment 1.

Note that, in the optical module 100 of Embodiment 5, as described in Embodiment 3, the amount of the thermosetting shrinkage of the resin bonding material 10 for the optical receiver 12 with the elapse of the exposure time may be made larger than the amount of the thermosetting shrinkage of the resin bonding material 8 for the lens 3. In this case, in the optical module 100 of Embodiment 5, by making the amount of the thermosetting shrinkage of the resin bonding material 10 with the elapse of the exposure time larger than that of the resin bonding material 8, the correction amount of the optical output is made large when the automatic optical power control is performed, and the fluctuation of the optical output can be suppressed in a small fluctuation width.

As described above, the optical module 100 of Embodiment 5 is an optical module that transmits the emission light 16 emitted from the semiconductor laser 1 through the optical fiber 4. The optical module 100 of Embodiment 5 includes the semiconductor laser 1, the optical fiber 4, the optical receiver 12 that receives the monitor light 17 emitted from the end face (second end face 72) opposite to the emission end face (first end face 71) from which the emission light 16 is emitted, the lens 3 that condenses the emission light 16, the carrier 5 on which the semiconductor laser 1, the optical receiver 12, and lens 3 are mounted, and the control circuit 20 that controls the injection current Iop of the semiconductor laser 1 such that the output current (monitor current Im) of the optical receiver 12 is kept constant. The optical receiver 12 includes the other lens 9 to condense the monitor light 17, and the optical receiver 2 to receive the monitor light 17 condensed by the other lens 9. The semiconductor laser 1 is fixed on the carrier 5 with the metal bonding material 6, the light receiving element 2 is fixed on the carrier 5 with the metal bonding material 11, and the other lens 9 that is at least a part of the optical receiver 12, and the lens 3 are fixed on the carrier 5 with the first resin bonding material (resin bonding material 10) and the second resin bonding material (resin bonding material 8), respectively, which undergo the thermosetting shrinkage. The position of the tip end part of the optical fiber 4 into which the emission light 16 is introduced is fixed with respect to the reference as the rear surface 24 opposite to the front surface of the mounting section (first mounting section 25, third mounting section 27, fourth mounting section 28, and second mounting section 26) on which the semiconductor laser 1, the optical receiver 12 and the lens 3 are mounted on the carrier 5. The optical coupling efficiency between the semiconductor laser 1 and the receiver 12 and the optical coupling efficiency between the semiconductor laser 1 and the optical fiber 4 with respect to the exposure time during which the optical module 100 is exposed to the environmental temperature higher than room temperature are referred to as the first optical coupling efficiency characteristic and the second optical coupling efficiency characteristic, respectively, and the initial positions in the semiconductor laser 1, the tip end part of the optical fiber 4, the optical receiver 12, and the lens 3 with respect to the reference as the rear surface 24 of the carrier 5 when the exposure time of the optical module is 0 is determined such that change trends of the first optical coupling efficiency characteristic and the second optical coupling efficiency characteristic are to be the same. In the optical module 100 of Embodiment 5, with the configuration described above, since the initial positions in the semiconductor laser 1, the tip end part of the optical fiber 4, the lens 3, and the optical receiver 12 with respect to the reference as the rear surface 24 of the carrier 5 are determined such that the change trends of the first optical coupling efficiency characteristic and the second optical coupling efficiency characteristic with the elapse of the exposure time are to be the same, the fluctuation of the optical output can be suppressed even if the irreversible compound relative positional deviation due to the high temperature environment occurs between the semiconductor laser 1 and the optical fiber 4.

Embodiment 6

Figure 29:
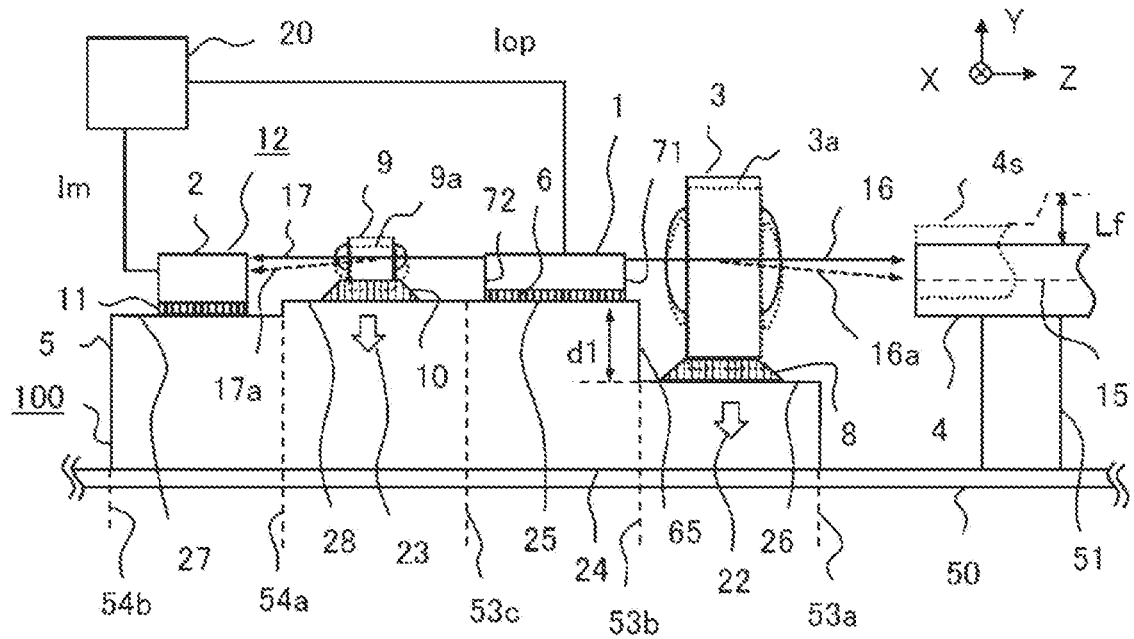
FIG. 29 is a diagram showing a first example of an optical module according to Embodiment 6.
Figure 30:
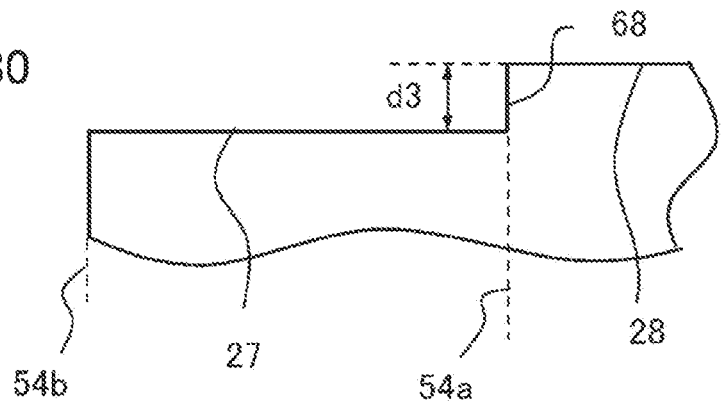
FIG. 30 is a diagram showing a main part of a mounting section in an optical receiver in FIG. 29.
Figure 31:
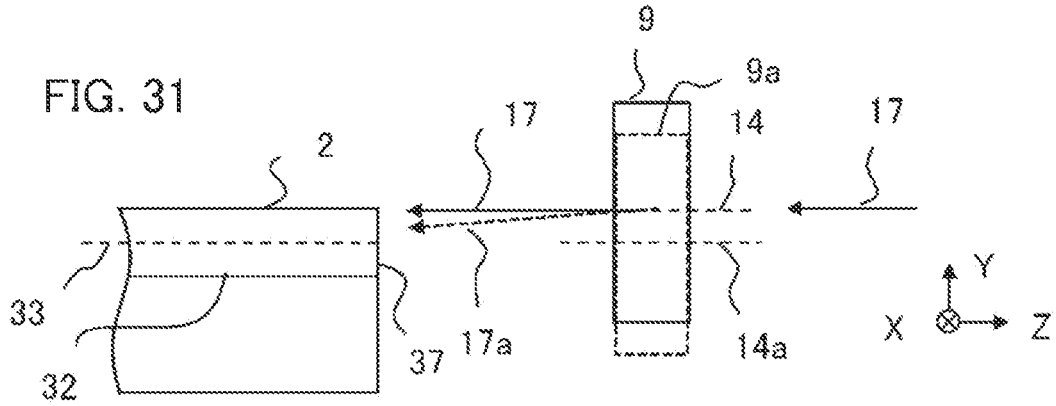
FIG. 31 is a diagram showing positional changes of a lens for monitoring light and the monitor light in FIG. 29.
Figure 32:
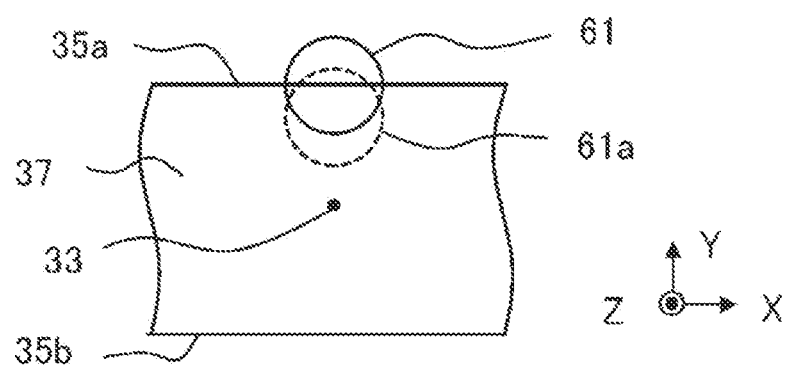
FIG. 32 is a diagram showing monitor light on a light receiving surface of a light receiving element in FIG. 29.
Figure 33:
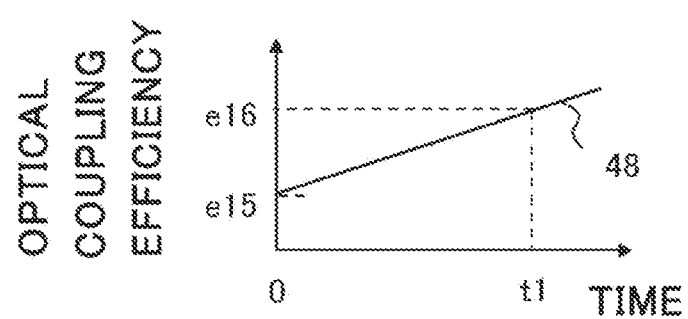
FIG. 33 is a diagram showing an optical coupling efficiency characteristic between a semiconductor laser and the light receiving element according to Embodiment 6.
Figure 34:
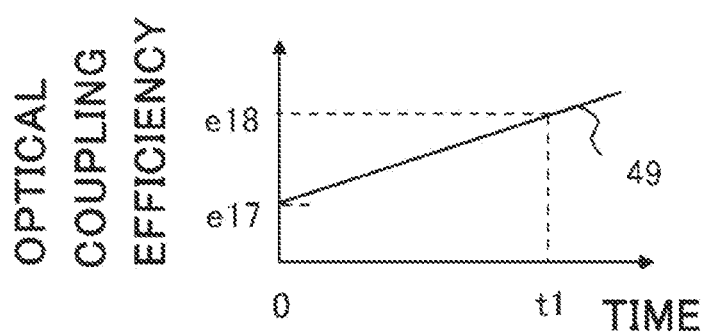
FIG. 34 is a diagram showing an optical coupling efficiency characteristic between the semiconductor laser and an optical fiber according to Embodiment 6.
Figure 35:
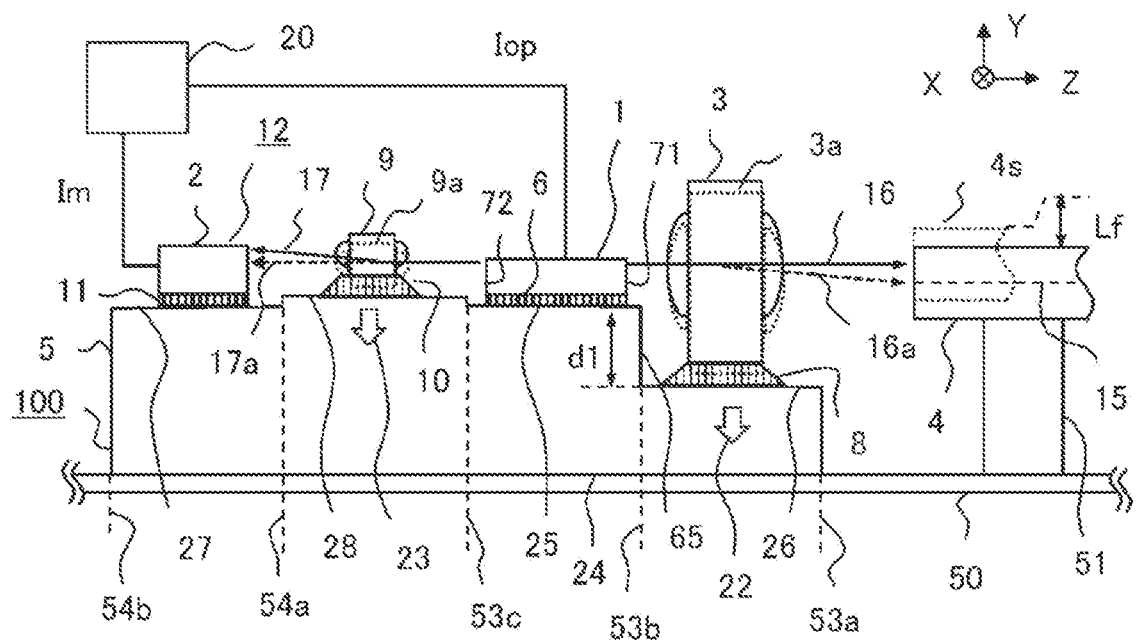
FIG. 35 is a diagram showing a second example of the optical module according to Embodiment 6.
Figure 36:
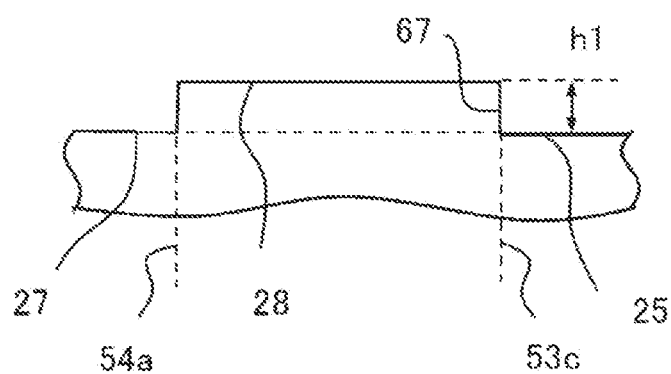
FIG. 36 is a diagram showing a main part of a mounting section in an optical receiver in FIG. 35.
Figure 37:
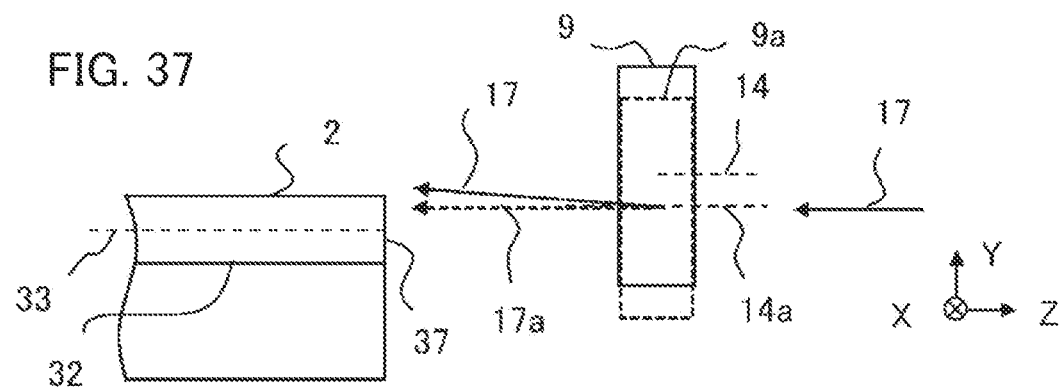
FIG. 37 is a diagram showing positional changes of a lens for monitoring light and the monitor light in FIG. 35.
Figure 38:
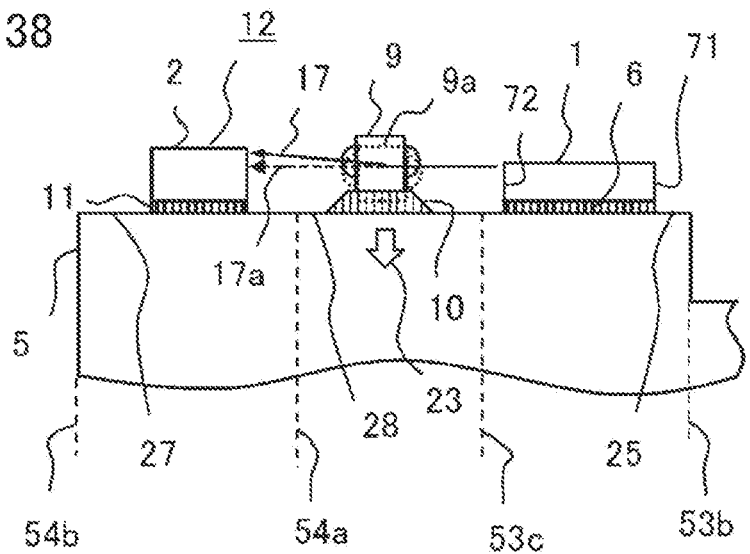
FIG. 38 is a diagram showing a main part of a third example of the optical module according to Embodiment 6.
Figure 39:
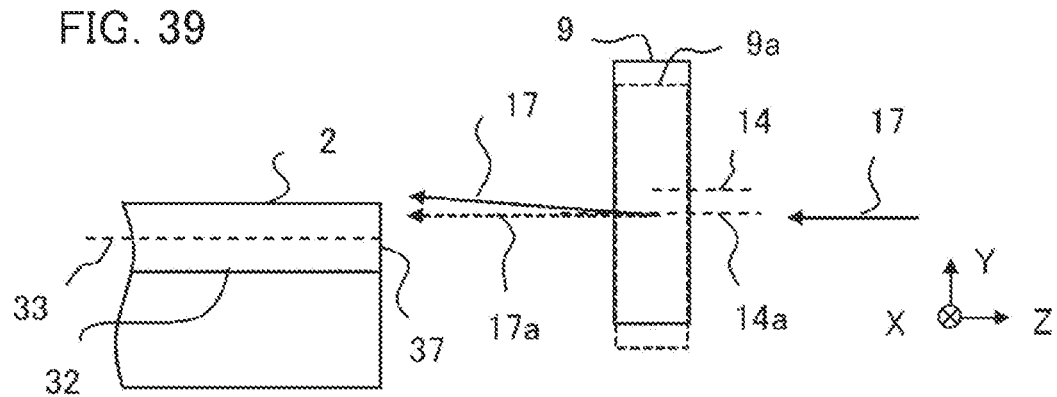
FIG. 39 is a diagram showing positional changes of a lens for monitoring light and the monitor light in FIG. 38.

FIG. 29 is a diagram showing a first example of the optical module according to Embodiment 6, and FIG. 30 is a diagram showing a main part of a mounting section in the optical receiver in FIG. 29. FIG. 31 is a diagram showing positional changes in the lens for monitoring light and the monitor light in FIG. 29, and FIG. 32 is a diagram showing the monitor light in the light receiving surface of the light receiving element in FIG. 29. FIG. 33 is a diagram showing an optical coupling efficiency characteristic between the semiconductor laser and the light receiving element according to Embodiment 6, and FIG. 34 is a diagram showing an optical coupling efficiency characteristic between the semiconductor laser and the optical fiber according to Embodiment 6. FIG. 35 is a diagram showing a second example of the optical module according to Embodiment 6, and FIG. 36 is a diagram showing a main part of a mounting section in the optical receiver in FIG. 35. FIG. 37 is a diagram showing positional changes in the lens for monitoring light and the monitor light in FIG. 35. FIG. 38 is a diagram showing a main part of a third example of the optical module according to Embodiment 6, and FIG. 39 is a diagram showing positional changes in the lens for monitoring light and the monitor light in FIG. 38.

The optical module 100 of Embodiment 6 is different from the optical module 100 of Embodiment 2 in that the optical receiver 12 includes the light receiving element 2 and the lens 9. The different parts from the optical module 100 of Embodiment 2 will be mainly described. The first example of the optical module 100 of Embodiment 6 shown in FIG. 29 and the second example of the optical module 100 of Embodiment 6 shown in FIG. 35 are examples in which the optical receiver 12 including the light receiving element 2 and the lens 9 is applied to the first example of the optical module 100 of Embodiment 2 shown in FIG. 7. The third example of the optical module 100 of Embodiment 6 with the main part shown in FIG. 38 is an example in which the size of the lens 9 is changed from that of the second example of the optical module 100 of Embodiment 6 shown in FIG. 35, and the surfaces of the mounting sections for the semiconductor laser 1, the lens 9, and the light receiving element 2 are flat surfaces with no difference in height. The first example of the optical module 100 of Embodiment 6 shown in FIG. 29 is an example in which the monitor light 17 traveling straight at the initial time is received by the light receiving element 2, and the monitor light 17 moves to the negative side in the Y-direction as the exposure time elapses and is received by the light receiving element 2. The second example of the optical module 100 of Embodiment 6 shown in FIG. 35 and the third example of the optical module 100 of Embodiment 6 with the main part shown in FIG. 38 is an example in which the monitor light 17 bent to the positive side in the Y-direction by the lens 9 at the initial time is received by the light receiving element 2, and the monitor light 17 moves to the negative side in the Y-direction as the exposure time elapses and is received by the light receiving element 2.

In the optical module 100 of Embodiment 6, as in the optical module 100 of Embodiment 2, the initial positions in the semiconductor laser 1, the tip end part of the optical fiber 4, the lens 3, and the light receiving element 2 serving as the optical receiver 12 with respect to the reference as the rear surface 24 of the carrier 5 are determined such that the change trends of the first optical coupling efficiency characteristic and the second optical coupling efficiency characteristic are to be the same with the elapse of the exposure time; for example, the change trends are to be the same increasing trend in a certain period of time from the initial time. Therefore, the fluctuation of the optical output is suppressed even if the optical coupling efficiency between the semiconductor laser 1 and the optical fiber 4 changes owing to the compound relative positional deviation that occurs between the semiconductor laser 1 and the optical fiber 4 with the elapse of the exposure time.

The monitor light 17 emitted from the second end face 72 of the semiconductor laser 1 is condensed by the lens 9 and received by the light receiving element 2. The light receiving element 2 is fixed on the front surface of the third mounting section 27 of the carrier 5 with the metal bonding material 11 that does not undergo the thermosetting shrinkage. And the lens 9 is fixed on the front surface of the fourth mounting section 28 of the carrier 5 with the resin bonding material 10 that undergoes the thermosetting shrinkage. The metal bonding material 11 is, for example, solder such as AuSn, SnAg, or SnAgCu, similar to the metal bonding material 6. The resin bonding material 10 is, for example, a bonding material containing acrylic, epoxy, thiol, or the like as a main component, similar to the resin bonding material 8. In the optical module 100 of Embodiment 2, the light receiving element 2 serving as the optical receiver 12 is fixed on the front surface of the third mounting section 27 of the carrier 5 with the resin bonding material 7 that undergoes the thermosetting shrinkage. In contrast, in the optical module 100 of Embodiment 6, the light receiving element 2 that is a part of the optical receiver 12 is fixed on the carrier 5 with the metal bonding material 11 that does not undergo the thermosetting shrinkage, and the lens 9 that is a part of the optical receiver 12 is fixed on the carrier 5 with the resin bonding material 10 that undergoes the thermosetting shrinkage. When the resin bonding material 10 is exposed to the environmental temperature higher than room temperature, the resin bonding material 10 undergoes the thermosetting shrinkage depending on the exposure time of exposure to the environmental temperature higher than room temperature, and the thickness thereof in the Y-direction decreases as indicated by an arrow 23.

The lens 9 moves to the front surface side of the fourth mounting section 28 due to the thermosetting shrinkage of the resin bonding material 10, and the lens 3 moves to the front surface side of the second mounting section 26 due to the thermosetting shrinkage of the resin bonding material 8. The lenses 9 and 3 after the elapse of the exposure time are shown as lenses 9a and 3a indicated by broken lines. As the exposure time elapses, the positional relationship in the semiconductor laser 1, the light receiving element 2 and the lens 9 that constitute the optical receiver 12, the lens 3, and the optical fiber 4 with respect to the reference as the rear surface 24 of the carrier 5, that is, the positional relationship thereof in the Y-direction changes. Therefore, in the optical module 100 of Embodiment 6, the optical coupling efficiency between the semiconductor laser 1 and the optical receiver 12 and the optical coupling efficiency between the semiconductor laser 1 and the optical fiber 4 change as in the optical module 100 of Embodiment 2.

In the first example of the optical module 100 of Embodiment 6, the second mounting section 26, the first mounting section 25, the fourth mounting section 28, and the third mounting section 27 are arranged from the side closer to the optical fiber 4. The range from the broken line 53a to the broken line 53b is the second mounting section 26, the range from the broken line 53b to the broken line 53c is the first mounting section 25, the range from the broken line 53c to the broken line 54a is the fourth mounting section 28. And the range from the broken line 54a to the broken line 54b is the third mounting section 27. The second mounting section 26 is a portion corresponding to the recess 65 formed on the front surface side of the carrier 5, and the front surface of the second mounting section 26 corresponds to the bottom surface of the recess 65 opposite to the rear surface 24. The length d1 between the front surface of the first mounting section 25 and the front surface of the second mounting section 26 in the Y-direction corresponds to the depth of the recess 65. The third mounting section 27 is a portion corresponding to a recess 68 formed on the front surface side of the carrier 5, and the front surface of the third mounting section 27 corresponds to the bottom surface of the recess 68 opposite to the rear surface 24. A length d3 between the front surface of the fourth mounting section 28 and the front surface of the third mounting section 27 in the Y-direction corresponds to the depth of the recess 68. The front surface of the first mounting section 25 and the front surface of the fourth mounting section 28 are flat surfaces with no difference in height.

As described above, the optical coupling efficiencies between the semiconductor laser 1 and the optical receiver 12 and between the semiconductor laser 1 and the optical fiber 4 with respect to the exposure time are referred to as the first optical coupling efficiency characteristic and the second optical coupling efficiency characteristic, respectively. In the optical module 100 of Embodiment 6, the automatic optical power control is performed, and the initial positions with respect to the reference as the rear surface 24 of the carrier 5 in the lens 9 that is a part of the optical receiver 12, and the lens 3, which move toward the front surface side of the carrier 5 with the elapse of the exposure time, are determined such that the change trends of the first optical coupling efficiency characteristic and the second optical coupling efficiency characteristic are to be the same. Therefore, the fluctuation of the optical output is suppressed even if the irreversible compound relative positional deviation due to the high temperature environment occurs between the semiconductor laser 1 and the optical fiber 4.

FIG. 29 shows an example of the optical module 100 when the change trends of the first optical coupling efficiency characteristic and the second optical coupling efficiency characteristic are increasing trends, that is, when the first optical coupling efficiency characteristic and the second optical coupling efficiency characteristic increase over time in a certain period of time from the initial time. In the first example of the optical module 100 of Embodiment 6 shown in FIG. 29, the initial positions in the semiconductor laser 1, the tip end part of the optical fiber 4, the lens 3, and the light receiving element 2 and the lens 9 that constitute the optical receiver 12 with respect to the reference as the rear surface 24 of the carrier 5 are determined such that the change trends of the first optical coupling efficiency characteristic and the second optical coupling efficiency characteristic are to be the same with the elapse of the exposure time; for example the change trends are to be the same increasing trend in a certain period of time from the initial time. (the above-described second optical coupling efficiency setting condition).

The monitor light 17 emitted from the emission portion 39, which is a region of the active layer 31 of the semiconductor laser 1 on the side of the second end face 72, is condensed by the lens 9, and the condensed light of the monitor light 17 is received by the light receiving portion 32 of the light receiving element 2. FIG. 33 and FIG. 34 show an example of an optical coupling efficiency characteristic between the semiconductor laser 1 and the light receiving element 2 of the optical receiver 12 when the reference time t1 is 2000 hours, and an example of an optical coupling efficiency characteristic between the semiconductor laser 1 and the optical fiber 4 when the reference time t1 is 2000 hours, respectively. The horizontal axis is the time of exposure to environmental temperature higher than room temperature, that is, the exposure time, and the vertical axis is the optical coupling efficiency. An optical coupling efficiency characteristic 48 shown in FIG. 33 indicates the relationship between the optical coupling efficiency between the semiconductor laser 1 and the optical receiver 12, and the exposure time. In the optical coupling efficiency characteristic 48, the optical coupling efficiency increases with the elapse of the exposure time and the change trend in the characteristic is an increasing trend. The optical coupling efficiencies at the exposure time 0 and t1 are e15 and e16, respectively. An optical coupling efficiency characteristic 49 shown in FIG. 34 indicates the relationship between the optical coupling efficiency between the semiconductor laser 1 and the optical fiber 4, and the exposure time. In the optical coupling efficiency characteristic 49, the optical coupling efficiency increases with the elapse of the exposure time and the change trend in the characteristic is an increasing trend. The optical coupling efficiencies at the exposure time 0 and t1 are e17 and e18, respectively.

The change in the optical coupling efficiency between the semiconductor laser 1 and the optical fiber 4 associated with the positions of the semiconductor laser 1 and the optical fiber 4 is the same as that in Embodiment 2, and the description thereof will not be repeated. The change in the optical coupling efficiency between the semiconductor laser 1 and the optical receiver 12 associated with the positions of the semiconductor laser 1 and the receiver 12 will be explained.

FIG. 31 shows the positions of the lens 9 and the light receiving element 2 in the Y-direction when the exposure time is 0, that is, at the initial time, and FIG. 32 shows the beam cross section 61 of the monitor light 17 condensed on the light receiving surface 37 in this case. FIG. 31 shows the positions of the lens 9a and the light receiving element 2 in the Y-direction when the exposure time is t1 or more, that is, when the reference time has elapsed, and FIG. 32 shows the beam cross section 61a of the monitor light 17 condensed on the light receiving surface 37 in this case. Since the monitor light 17 is condensed, the beam cross sectional area is smaller than that in FIG. 10 of Embodiment 2. FIGS. 29, 31, and 32 show examples in which the monitor light 17 on the light receiving surface 37 moves to the negative side in the Y-direction as the lens 9 moves to the negative side in the Y-direction.

The optical coupling efficiency between the semiconductor laser 1 and the optical receiver 12 varies depending on an increase or decrease in the beam cross sectional area, that is, the light receiving area, of the monitor light 17 incident on the light receiving surface 37. When the exposure time is 0, the monitor light 17 travels straight to the negative side in the Z direction along the lens central axis 14 of the lens 9, and for example, the monitor light is in a position in which the area thereof including the light receiving portion end 35a in the light receiving surface 37 is half of the beam cross section 61. When the exposure time is t1 or more, the monitor light 17 passes through the positive side in the Y-direction from the lens central axis 14a of the lens 9a that is the lens 9 after the movement to the negative side in the Y-direction, so that the monitor light 17a traveling to the negative side in the Y-direction as the monitor light 17 is incident on the light receiving surface 37 of the light receiving element 2 of the optical receiver 12. The beam cross section 61a of the monitor light 17a on the light receiving surface 37 is moved to the negative side in the Y-direction. The area of the beam cross section 61 on the light receiving surface 37 is smaller than the area of the beam cross section 61a on the light receiving surface 37, and the light receiving area increases with the elapse of the exposure time, so that the optical coupling efficiency between the semiconductor laser 1 and the light receiving element 2 increases with the elapse of the exposure time.

In the first example of the optical module 100 of Embodiment 6, the monitor light 17 of the semiconductor laser 1 introduced into the light receiving element 2 can also be condensed by the lens 9 in the same manner as the emission light 16 of the semiconductor laser 1 introduced into the optical fiber 4. Therefore, the amount of change in the optical coupling efficiency between the semiconductor laser 1 and the light receiving element 2 caused by the thermosetting shrinkage of the resin bonding material 10 is easy to be made larger than that of the optical module 100 of Embodiment 2 in which the optical receiver 12 is not provided with the lens 9. This is because when the area of the beam cross section on the light receiving surface 37 is small, the ratio of the area that deviates from the light receiving surface 37 is larger than that when the area of the beam cross section is large, even if the travel distance in the Y-direction is the same. Therefore, it is easy to design the optical module such that the amount of increase in the optical coupling efficiency between the semiconductor laser 1 and the light receiving element 2 due to the elapse of the exposure time in the high temperature environment is equal to the amount of increase in the optical coupling efficiency between the semiconductor laser 1 and the optical fiber 4.

In the first example of the optical module 100 of Embodiment 6, when the automatic optical power control is performed, the change in the optical coupling efficiency in the light receiving element 2 is larger than that in the optical module 100 of Embodiment 2, so that the correction amount of the optical output of the optical module 100 is to be larger. As described in Embodiment 3, the first example of the optical module 100 of Embodiment 6 can increase the detection sensitivity of the compound relative positional deviation between the semiconductor laser 1 and the optical fiber 4 with the elapse of the exposure time as compared with the optical module 100 of Embodiment 2, and can increase the correction speed of the optical coupling efficiency associated with the compound relative positional deviation between the semiconductor laser 1 and the optical fiber 4 with the elapse of the exposure time. Therefore, the first example of the optical module 100 of Embodiment 6 can suppress the fluctuation of the optical output in a smaller fluctuation width than that of the optical module 100 of Embodiment 2.

In the first example of the optical module 100 of Embodiment 6, since the semiconductor laser 1 and the light receiving element 2 are fixed on the carrier 5 with the metal bonding materials 6 and 11, it is difficult to finely adjust the optical coupling efficiency between the semiconductor laser 1 and the light receiving element 2, and thus the setting of the thicknesses in the resin bonding material 10 for the lens 9 and the length d3 of the recess 68 in the Y-direction, etc. makes the lens 9 to be offset to the positive side in the Y-direction from, for example, the position at which the optical coupling efficiency between the semiconductor laser 1 and the light receiving element 2 is maximized or substantially maximized. In addition, as described in Embodiment 2, the tip end part of the optical fiber 4 is offset to the negative side in the Y-direction from the position where the optical coupling efficiency between the semiconductor laser 1 and the optical fiber 4 is maximized or substantially maximized. As described above, by setting the initial positions in the semiconductor laser 1, the tip end part of the optical fiber 4, the optical receiver 12, and the lens 3 with respect to the reference as the rear surface 24 of the carrier 5, the first optical coupling efficiency characteristic and the second optical coupling efficiency characteristic can be made to increase over time at least in a certain period of time from the initial time. FIG. 29 illustrates an example in which the thicknesses of the resin bonding material 8 in the Y-direction and the resin bonding material 10 in the Y-direction are equal to each other. When the resin bonding material 8 for the lens 3 and the resin bonding material 10 for the lens 9 are made from the same material, the optical coupling efficiency between the semiconductor laser 1 and the optical fiber 4 is set in the same way in the optical module 100 of Embodiment 2, and the first condition or the second condition described in Embodiment 5 is satisfied, the amount of increase in the optical coupling efficiency between the semiconductor laser 1 and the light receiving element 2 and the amount of increase in the optical coupling efficiency between the semiconductor laser 1 and the optical fiber 4 with the elapse of the exposure time in the high temperature environment can be made to be equal.

Next, the second example of the optical module 100 of Embodiment 6 will be described. The second example of the optical module 100 of Embodiment 6 shown in FIG. 35 differs from the first example of the optical module 100 of Embodiment 6 shown in FIG. 29 in that the front surface of the fourth mounting section 28 on which the lens 9 is fixed is located on the positive side in the Y-direction with respect to the front surface of the first mounting section 25 on which the semiconductor laser 1 is fixed and the front surface of the third mounting section 27 on which the light receiving element 2 is fixed, the monitor light 17 initially bent to the positive side in the Y-direction by the lens 9 is received by the light receiving element 2, and as the exposure time elapses, the monitor light 17 moves to the negative side in the Y-direction and is received by the light receiving element 2. The different parts from the first example of the optical module 100 of Embodiment 6 will be mainly described.

The fourth mounting section 28 is a portion corresponding to a protrusion 67 formed on the front surface side of the carrier 5, and the front surface of the fourth mounting section 28 corresponds to the top surface of the protrusion 67 opposite to the rear surface 24. A length h1 in the Y-direction between the front surfaces of the fourth mounting section 28 and the third mounting section 27, and between the front surfaces of the fourth mounting section 28 and the first mounting section 25 corresponds to the height of the protrusion 67. The front surfaces of the first mounting section 25 and the third mounting section 27 have no difference in height.

FIG. 37 shows the positions of the lens 9 and the light receiving element 2 in the Y-direction when the exposure time is 0, that is, at the initial time, and the beam cross section 61 of the monitor light 17 condensed on the light receiving surface 37 in this case is the same as that shown in FIG. 32. FIG. 37 shows the positions of the lens 9a and the light receiving element 2 in the Y-direction when the exposure time is t1 or more, that is, when the reference time has elapsed, and the beam cross section 61a of the monitor light 17 condensed on the light receiving surface 37 in this case is the same as that shown in FIG. 32. Since the monitor light 17 is condensed, the beam cross sectional area is smaller than that in FIG. 10 of Embodiment 2. FIG. 35, FIG. 37, and FIG. 32 show examples in which the monitor light 17 on the light receiving surface 37 moves to the negative side in the Y-direction as the lens 9 moves to the negative side in the Y-direction.

When the exposure time is 0, the monitor light 17 passes through the lens on the negative side in the Y-direction with respect to the lens central axis 14 of the lens 9, and the monitor light 17 bent to the positive side in the Y-direction by the lens 9 is incident on the light receiving surface 37 of the light receiving element 2 of the optical receiver 12. For example, the monitor light is in a position in which the area thereof including the light receiving portion end 35a in the light receiving surface 37 is half of the beam cross section 61. When the exposure time is t1 or more, the monitor light 17 passes through the lens central axis 14a of the lens 9a that is the lens 9 after the movement to the negative side in the Y-direction, and thus the monitor light 17a traveling to the negative side in the Y-direction as the monitor light 17 is incident on the light receiving surface 37 of the light receiving element 2 of the optical receiver 12. As shown in FIG. 32, the beam cross section 61a of the monitor light 17a on the light receiving surface 37 moves to the negative side in the Y-direction. Since the area of the beam cross section 61 on the light receiving surface 37 is smaller than the area of the beam cross section 61a on the light receiving surface 37 and the light receiving area increases with the elapse of the exposure time, the optical coupling efficiency between the semiconductor laser 1 and the light receiving element 2 increases with the elapse of the exposure time.

Next, the third example of the optical module 100 of Embodiment 6 will be described. The third example of the optical module 100 of Embodiment 6 differs from the first example of the optical module 100 of Embodiment 6 in the front surface of carrier 5 from the broken line 53b to the broken line 54b, the size of lens 9, and the traveling direction of the monitor light 17. The different parts from the first example of the optical module 100 of Embodiment 6 will be mainly described.

The front surfaces of the first mounting section 25, the fourth mounting section 28, and the third mounting section 27 are flat surfaces having no height difference from each other. FIG. 39 shows the positions of the lens 9 and the light receiving element 2 in the Y-direction when the exposure time is 0, that is, at the initial time, and the beam cross section 61 of the monitor light 17 condensed on the light receiving surface 37 in this case is the same as that shown in FIG. 32. FIG. 39 shows the positions of the lens 9a and the light receiving element 2 in the Y-direction when the exposure time is t1 or more, that is, when the reference time has elapsed, and the beam cross section 61a of the monitor light 17 condensed on the light receiving surface 37 in this case is the same as that shown in FIG. 32. Since the monitor light 17 is condensed, the beam cross sectional area is smaller than that in FIG. 10 of Embodiment 2. FIG. 38, FIG. 39, and FIG. 32 show examples in which the monitor light 17 on the light receiving surface 37 moves to the negative side in the Y-direction as the lens 9 moves to the negative side in the Y-direction. The monitor light 17 when the exposure time is 0 and the monitor light 17a when the exposure time is t1 or more are the same as those in the second example.

In the second example and the third example of the optical module 100 of Embodiment 6, since the optical receiver 12 in the optical module 100 of Embodiment 2 includes the light receiving element 2 and the lens 9 as in the first example, the same effects as those of the first example of the optical module 100 of Embodiment 6 are achieved.

In the optical module 100 of Embodiment 6, the semiconductor laser 1 and the light receiving element 2 are fixed on the carrier 5 with the metal bonding materials 6 and 11 at the same time, and the lens 3 and the lens 9 are fixed on the carrier 5 with the resin bonding materials 8 and 10 at the same time. Therefore, the fixing time for the optical receiver 12 can be shortened as compared with the optical module 100 of Embodiment 2. In addition, in the optical module 100 of Embodiment 6, since the light receiving element 2 is fixed on the carrier 5 with the metal bonding material 11, the heat dissipation of the light receiving element 2 can be improved as compared with the optical module 100 of Embodiment 2.

Note that, in the first to third examples of the optical module 100 of Embodiment 6, the lens 3 may be offset to the positive side in the Y-direction instead of offsetting the optical fiber 4 to the negative side in the Y-direction as in the second example of Embodiment 2. In this case as well, the initial positions in the semiconductor laser 1, the tip end part of the optical fiber 4, the lens 3, and the light receiving element 2 serving as the optical receiver 12 with respect to the reference as the rear surface 24 of the carrier 5 can be determined such that the change trends of the first and second optical coupling efficiency characteristics are to be the same with the elapse of the exposure time; the change trend is to be the same increasing trend in a certain period of time from the initial time. In addition, in the optical module 100 of Embodiment 6, as described in Embodiment 3, the amount of thermosetting shrinkage of the resin bonding material 10 for the optical receiver 12 with the elapse of the exposure time may be made larger than the amount of thermosetting shrinkage of the resin bonding material 8 for the lens 3. In this case, in the optical module 100 of Embodiment 6, by making the amount of thermosetting shrinkage of the resin bonding material 10 with the elapse of the exposure time larger than that of the resin bonding material 8, the correction amount of the optical output is made larger when the automatic optical power control is performed, and the fluctuation of the optical output can be suppressed in a small fluctuation width.

Note that, as described with reference to FIG. 13 and FIG. 14 of Embodiment 2, when the optical coupling efficiency characteristic 49 shown in FIG. 34 has a peak to be reached, the change may end and the optical coupling efficiency characteristic may have a constant value. In this case, in the optical module 100 of Embodiment 6, the automatic optical power control is performed, and the initial positions with respect to the reference as the rear surface 24 of the carrier 5 in the lens 9 that is a part of the optical receiver 12, and the lens 3, which move toward the front surface side of the carrier 5 with the elapse of the exposure time, are determined such that the change trends of the first optical coupling efficiency characteristic and the second optical coupling efficiency characteristic are to be the same in a certain period of time from the initial time. Therefore, the fluctuation of the optical output can be suppressed even if the irreversible compound relative positional deviation due to the high temperature environment occurs between the semiconductor laser 1 and the optical fiber 4.

Further, as described in Embodiment 2, also in the optical coupling efficiency characteristic between the semiconductor laser 1 and the optical receiver 12, when the optical coupling efficiency characteristic has a peak to be reached in the middle of the time to the reference time t1, the change may end and the optical coupling efficiency characteristic may have a constant value. In this case, since the optical coupling efficiency between the semiconductor laser 1 and the optical fiber 4 and the optical coupling efficiency between the semiconductor laser 1 and the light receiving element 2 change in the same manner with the exposure time, the first optical coupling efficiency characteristic and the second optical coupling efficiency characteristic have the same change trend. In the optical module 100 of Embodiment 6, since the automatic optical power control is performed, and the initial positions with respect to the reference as the rear surface 24 of the carrier 5 in the lens 9 that is a part of the optical receiver 12, and the lens 3, which move toward the front surface side of the carrier 5 with the elapse of the exposure time are determined such that the change trends of the first optical coupling efficiency characteristic and the second optical coupling efficiency characteristic are to be the same, the fluctuation of the optical output can be suppressed even if the irreversible compound relative positional deviation due to the high temperature environment occurs between the semiconductor 1 laser and the optical fiber 4.

Note that, although various exemplary embodiments and examples are described in the present application, various features, aspects, and functions described in one or more embodiments are not inherent in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: semiconductor laser, 2, 2a: light receiving element, 3, 3a: lens, 4, 4s: optical fiber, 5: carrier, 6: metal bonding material, 7: resin bonding material (first resin bonding material), 8: resin bonding material (second resin bonding material), 9, 9a: lens, 10: resin bonding material (first resin bonding material), 11: metal bonding material, 12: optical receiver, 15: central axis, 16, 16a: emission light, 17, 17a: monitor light, 18: monitor light, 20: control circuit, 24: rear surface, 25: first mounting section, 26: second mounting section, 27: third mounting section, 28: fourth mounting section, 30, 30a: light receiving element, 37: light receiving surface, 39: emission portion, 40: optical axis, 41, 41a: optical coupling efficiency characteristic, 42: optical coupling efficiency characteristic, 43: optical coupling efficiency characteristic, 44: optical coupling efficiency characteristic, 45a, 45b: optical coupling efficiency characteristic, 46: optical coupling efficiency characteristic, 47: optical coupling efficiency characteristic, 48: optical coupling efficiency characteristic, 49: optical coupling efficiency characteristic, 71: first end face, 72: second end face, 100: optical module, 1m: monitor current (output current), Iop: injection current

The invention claimed is:

1. An optical module that transmits emission light emitted by a semiconductor laser through an optical fiber, the optical module comprising:
   the semiconductor laser and the optical fiber;
   an optical receiver to receive monitor light emitted from an end face opposite to an emission end face from which the emission light is emitted;
   a lens to condense the emission light;
   a carrier on which the semiconductor laser, the optical receiver, and the lens are mounted; and
   a control circuit to control an injection current of the semiconductor laser such that an output current of the optical receiver is kept constant, wherein the semiconductor laser is fixed on the carrier with a metal bonding material, the lens and at least a part of the optical receiver are respectively fixed on the carrier with a second resin bonding material and a first resin bonding material that undergo thermosetting shrinkage, a position of a tip end part of the optical fiber into which the emission light is introduced is fixed with respect to a reference as a rear surface of the carrier opposite to a front surface of a mounting section on which the semiconductor laser, the optical receiver, and the lens are mounted, an optical coupling efficiency between the semiconductor laser and the optical receiver and an optical coupling efficiency between the semiconductor laser and the optical fiber with respect to an exposure time during which the optical module is exposed to environmental temperature higher than room temperature are referred to as a first optical coupling efficiency characteristic and a second optical coupling efficiency characteristic, respectively, and initial positions in the semiconductor laser, the tip end part of the optical fiber, the optical receiver, and the lens with respect to the reference as the rear surface of the carrier when the exposure time of the optical module is 0 are determined such that change trends of the first optical coupling efficiency characteristic and the second optical coupling efficiency characteristic are to be the same.

2. The optical module according to claim 1, wherein change trends of the first optical coupling efficiency characteristic and the second optical coupling efficiency characteristic are decreasing trends.

3. The optical module according to claim 1, wherein change trends of the first optical coupling efficiency characteristic and the second optical coupling efficiency characteristic are increasing trends.

4. The optical module according to claim 1, wherein the optical fiber is disposed such that the emission light in a case without the lens is incident on a central axis of the optical fiber.

5. The optical module according to claim 1, wherein the optical fiber is disposed such that the emission light in a case without the lens is incident on a position farther away from a central axis of the optical fiber in a direction perpendicular to the rear surface of the carrier.

6. The optical module according to claim 1, wherein the optical fiber is disposed such that the emission light passing through the lens at the initial position is incident on a position farther away from a central axis of the optical fiber in a direction perpendicular to the rear surface of the carrier.

7. The optical module according to claim 2, wherein
the monitor light is more diffused than the emission light, and
a light receiving surface of the optical receiver is disposed closer to a side of the rear surface of the carrier than an emission portion of the monitor light, and does not intersect with an optical axis of the monitor light.

8. The optical module according to claim 1, wherein
the optical receiver includes the other lens to condense the monitor light, and a light receiving element to receive the monitor light condensed by the other lens,
the light receiving element is fixed on the carrier with the metal bonding material,
the other lens is fixed on the carrier with the first resin bonding material, and the first optical coupling efficiency characteristic is an optical coupling efficiency between the semiconductor laser and the light receiving element with respect to the exposure time.

9. The optical module according to claim 1, wherein the optical receiver is a light receiving element, and the light receiving element is fixed on the carrier with the first resin bonding material.

10. The optical module according to claim 1, wherein an amount of thermosetting shrinkage of the first resin bonding material caused when the first resin bonding material is exposed to environmental temperature higher than room temperature is larger than an amount of thermosetting shrinkage of the second resin bonding material.

11. The optical module according to claim 10, wherein a thickness of the first resin bonding material in a direction perpendicular to the rear surface of the carrier is larger than a thickness of the second resin bonding material in a direction perpendicular to the rear surface of the carrier.

12. The optical module according to claim 10, wherein the second resin bonding material is a bonding resin that is more advanced in the thermosetting shrinkage than the first resin bonding material.

13. The optical module according to claim 2, wherein the optical fiber is disposed such that the emission light in a case without the lens is incident on a central axis of the optical fiber.

14. The optical module according to claim 3, wherein the optical fiber is disposed such that the emission light in a case without the lens is incident on a position farther away from a central axis of the optical fiber in a direction perpendicular to the rear surface of the carrier.

15. The optical module according to claim 3, wherein the optical fiber is disposed such that the emission light passing through the lens at the initial position is incident on a position farther away from a central axis of the optical fiber in a direction perpendicular to the rear surface of the carrier.

16. The optical module according to claim 4, wherein
the monitor light is more diffused than the emission light, and
a light receiving surface of the optical receiver is disposed closer to a side of the rear surface of the carrier than an emission portion of the monitor light, and does not intersect with an optical axis of the monitor light.

17. The optical module according to claim 2, wherein
the optical receiver includes the other lens to condense the monitor light, and a light receiving element to receive the monitor light condensed by the other lens,
the light receiving element is fixed on the carrier with the metal bonding material,
the other lens is fixed on the carrier with the first resin bonding material, and
the first optical coupling efficiency characteristic is an optical coupling efficiency between the semiconductor laser and the light receiving element with respect to the exposure time.

18. The optical module according to claim 3, wherein
the optical receiver includes the other lens to condense the monitor light, and a light receiving element to receive the monitor light condensed by the other lens,
the light receiving element is fixed on the carrier with the metal bonding material,
the other lens is fixed on the carrier with the first resin bonding material, and the first optical coupling efficiency characteristic is an optical coupling efficiency between the semiconductor laser and the light receiving element with respect to the exposure time.

19. The optical module according to claim 4, wherein the optical receiver includes the other lens to condense the monitor light, and a light receiving element to receive the monitor light condensed by the other lens, the light receiving element is fixed on the carrier with the metal bonding material, the other lens is fixed on the carrier with the first resin bonding material, and the first optical coupling efficiency characteristic is an optical coupling efficiency between the semiconductor laser and the light receiving element with respect to the exposure time.

20. The optical module according to claim 5, wherein the optical receiver includes the other lens to condense the monitor light, and a light receiving element to receive the monitor light condensed by the other lens, the light receiving element is fixed on the carrier with the metal bonding material, the other lens is fixed on the carrier with the first resin bonding material, and the first optical coupling efficiency characteristic is an optical coupling efficiency between the semiconductor laser and the light receiving element with respect to the exposure time.

* * * * *